US012628378B2

(12) United States Patent　　　　(10) Patent No.:　US 12,628,378 B2
　　Liaw　　　　　　　　　　　　　　 (45) Date of Patent:　　May 12, 2026

(54) SEMICONDUCTOR MANUFACTURING

(71) Applicant: Taiwan Semiconductor Manufacturing Co., Ltd., Hsinchu (TW)

(72) Inventor: Jhon Jhy Liaw, Zhudong Township (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/339,697

(22) Filed: Jun. 22, 2023

(65) Prior Publication Data

US 2023/0335615 A1　　Oct. 19, 2023

Related U.S. Application Data

(60) Continuation of application No. 17/843,533, filed on Jun. 17, 2022, now Pat. No. 12,094,953, which is a (Continued)

(51) Int. Cl.
　　*H10D 30/67*　　　　(2025.01)
　　*H10D 30/01*　　　　(2025.01)
　　　　　　(Continued)

(52) U.S. Cl.
　　CPC ..... *H10D 30/6735* (2025.01); *H10D 30/0217* (2025.01); *H10D 30/024* (2025.01);
　　　　　　(Continued)

(58) Field of Classification Search
None
See application file for complete search history.

(56) References Cited

U.S. PATENT DOCUMENTS 9,412,828 B2　　8/2016　Ching et al.
9,472,618 B2　　10/2016　Oxland
　　　　　(Continued)

FOREIGN PATENT DOCUMENTS

CN　　105870062 A　　8/2016
CN　　108172549 A　　6/2018

*Primary Examiner* — Feifei Yeung Lopez
(74) *Attorney, Agent, or Firm* — Slater Matsil, LLP

(57)　　　　ABSTRACT

Short channel, horizontal gate-all-around (GAA) nanostructure (e.g., nanosheet, nanowire, or the like) transistors, methods of manufacturing and devices formed with the GAA transistors are disclosed herein. According to some methods, the GAA transistors are formed with a guard band for preventing diffusion of APT doping into the channel region, with shallow source/drain depths, and/or with epitaxial growth of the device channel regions after well and APT implantation in the substrate. As such, the GAA transistors are formed to mitigate issues such as bottom sheet voltage threshold (Vt) shift, junction leakage, APT dopant out-diffusion, well proximity effect, APT implant contamination that may be induced by anti-punch through (APT) doping diffusion during fabrication of gate all-around (GAA) transistors. The GAA transistors and methods of manufacturing, however, may be utilized in a wide variety of ways, and may be integrated into a wide variety of devices and technologies.

20 Claims, 16 Drawing Sheets

Related U.S. Application Data division of application No. 16/780,059, filed on Feb. 3, 2020, now Pat. No. 11,367,782.

(60) Provisional application No. 62/894,250, filed on Aug. 30, 2019.

(51) Int. Cl.
   *H10D 30/62*            (2025.01)
   *H10D 62/10*            (2025.01)

(52) U.S. Cl.
   CPC ..... *H10D 30/6211* (2025.01); *H10D 30/6757* (2025.01); *H10D 62/105* (2025.01)

(56)                References Cited

U.S. PATENT DOCUMENTS

| | | | |
|---|---|---|---|
| 9,502,265 | B1 | 11/2016 | Jiang et al. |
| 9,520,482 | B1 | 12/2016 | Chang et al. |
| 9,536,738 | B2 | 1/2017 | Huang et al. |
| 9,576,814 | B2 | 2/2017 | Wu et al. |
| 9,608,116 | B2 | 3/2017 | Ching et al. |
| 9,935,014 | B1 * | 4/2018 | Cheng ................... H01L 21/845 |
| 10,243,054 | B1 * | 3/2019 | Cheng ................... H01L 27/088 |
| 2015/0034899 | A1 | 2/2015 | Ching et al. |
| 2015/0194350 | A1 * | 7/2015 | Cai ........................ H01L 27/092 |
| | | | 438/587 |
| 2015/0325699 | A1 * | 11/2015 | Zhu ................... H01L 29/66795 |
| | | | 257/192 |
| 2016/0111495 | A1 * | 4/2016 | Brand .............. H01L 21/30612 |
| | | | 438/283 |
| 2016/0379978 | A1 * | 12/2016 | Ching ............ H01L 21/823828 |
| | | | 257/349 |
| 2017/0365604 | A1 | 12/2017 | Suh et al. |
| 2018/0006128 | A1 * | 1/2018 | Cheng ............ H01L 21/823475 |
| 2019/0165114 | A1 * | 5/2019 | Lee ................... H01L 21/76897 |
| 2019/0355723 | A1 * | 11/2019 | Miao ................. H01L 29/78684 |
| 2020/0006151 | A1 * | 1/2020 | Kao ................. H01L 21/31111 |
| 2020/0052107 | A1 * | 2/2020 | Lie ........................ H01L 27/088 |
| 2020/0091319 | A1 * | 3/2020 | Bao ................... H01L 21/76205 |

\* cited by examiner

SEMICONDUCTOR MANUFACTURING

PRIORITY CLAIM AND CROSS-REFERENCE

This application is a continuation of U.S. patent application Ser. No. 17/843,533, filed on Jun. 17, 2022, entitled "Semiconductor Manufacturing," which is a division of U.S. patent application Ser. No. 16/780,059, filed on Feb. 3, 2020, entitled "Semiconductor Manufacturing," now U.S. Pat. No. 11,367,782 issued on Jun. 21, 2022, which claims the benefit of U.S. Provisional Application No. 62/894,250, filed on Aug. 30, 2019, entitled "Semiconductor Devices and Methods of Manufacturing," which applications are hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
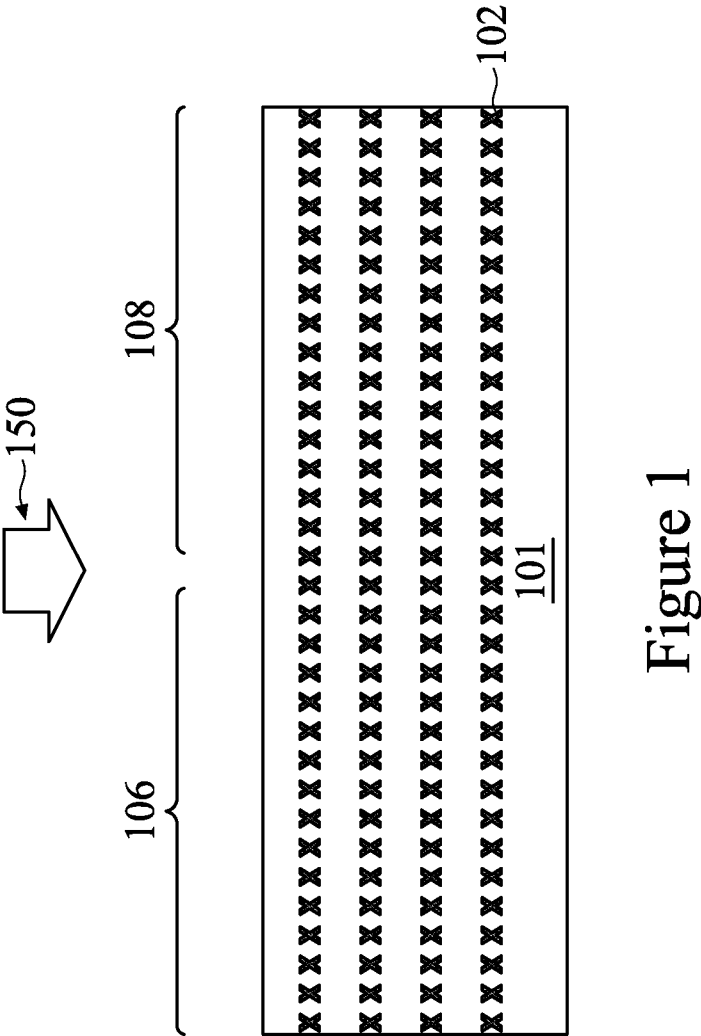
FIGS. 1-11 illustrate intermediate steps in the formation of a semiconductor device, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will now be described with respect to the integration of horizontal gate-all-around nanostructure transistors for use in the design and operation of integrated circuits in the 5 nm technology node and below. Such embodiments help to mitigate bottom sheet threshold voltage (Vt) shift issues that are induced by anti-punch through (APT) doping diffusion during fabrication of gate all-around (GAA) transistors. Embodiments, however, may be utilized in a wide variety of ways, and are not intended to be limited to the embodiments described herein.

With reference now to FIG. 1, there is illustrated a substrate 101 into which dopants have been implanted in order to form wells. In an embodiment the substrate 101 is a semiconductor substrate, which may be, for example, a silicon substrate, a silicon germanium substrate, a germanium substrate, a III-V material substrate (e.g., GaAs, GaP, GaAsP, AlInAs, AlGaAs, GaInAs, InAs, GaInP, InP, InSb, and/or GaInAsP; or a combination thereof), or a substrate formed of other semiconductor materials with, for example, high band-to-band tunneling (BTBT). Substrate 101 may be doped or un-doped. In some embodiments, substrate 101 may be a bulk semiconductor substrate, such as a bulk silicon substrate that is a wafer, a semiconductor-on-insulator (SOI) substrate, a multi-layered or gradient substrate, or the like.

FIG. 1 further illustrates that the substrate 101 comprises a first device region 106 for forming n-type devices, such as NMOS transistors (e.g., n-type gate all around transistors) and a second device region 108 for forming p-type devices, such as PMOS transistors (e.g., p-type gate all around transistors). To separate the first device region 106 and the second device region 108, wells (not separately illustrated in FIG. 1) may be formed within the substrate 101 with n-type dopants and p-type dopants. To form the desired wells, the n-type dopants and the p-type dopants are implanted into the substrate 101 depending upon the devices that are desired to be formed. For example, n-type dopants such as phosphorous or arsenic may be implanted to form n-type wells, while p-type dopants such as boron may be implanted to form p-type wells. The n-type wells and p-type wells may be formed using one or more implantation techniques such as diffusion implantations, ion implantations (e.g., plasma doping, beam line implant doping), selective implantations, deep-well implantations, and the like, or combinations thereof. Masking techniques may also be utilized to mask some regions (e.g., second device region 108) of the substrate 101 while exposing other regions (e.g., first device region 106) of the substrate 101 during a first well implantation (e.g., n-type wells) process.

Once the first well implantation process has been completed, the mask is removed to expose the previously masked regions (e.g., second device region 108) and another mask may be placed over the previously exposed regions (e.g., first device region 106) during a second well implantation (e.g., p-type wells) process. In some embodiments, further doping implantations may be performed to form deep well implant regions within the substrate 101.

According to some embodiments, one or more anti-punch through (APT) implantations (represented by the arrow labeled 150 in FIG. 1) are performed in order to implant anti-punch through dopants (represented in FIG. 1 by the Xs labeled 102) into the substrate 101. The anti-punch through dopants 102 help to reduce or prevent the short channel effect of electrons or holes punching through from the source to the drain. The anti-punch through dopants 102 in the first device region 106 may be doped the same as the well in the first device region 106 but with a higher dopant concentration and the anti-punch through region in the second device region 108 may be doped (in, e.g., a separate process) the same as the well in the second device region 108 but with a higher dopant concentration. Furthermore, the APT implantation process 150 may comprise a series of implant steps (e.g., Well-1, Well-2, and APT). According to some embodiments each implant step uses an implantation dosage into the substrate 101 with a concentration of between about $1E13/cm^2$ and about $1.5E14/cm^2$. However, any suitable implantation and dosage may be utilized.

For example, in a particular embodiment in which the first device region 106 is utilized to form an n-type gate all around transistor, the APT implantation process 150 including the series of implant steps will implant a p-type dopant into the first device region 106 to a concentration of between about $3E13/cm^2$ and about $5E14/cm^2$, such as about $1.5E14/cm^2$. Similarly, in an embodiment in which the second device region 108 is utilized to form a p-type gate all around transistor, the APT implantation process 150 will implant a n-type dopant into the second device region 108 to a concentration of between about $3E13/cm^2$ and about $5E14/cm^2$, such as about $1.5E14/cm^2$. However, any suitable dopants and any suitable concentrations may be utilized.

Figure 2A:
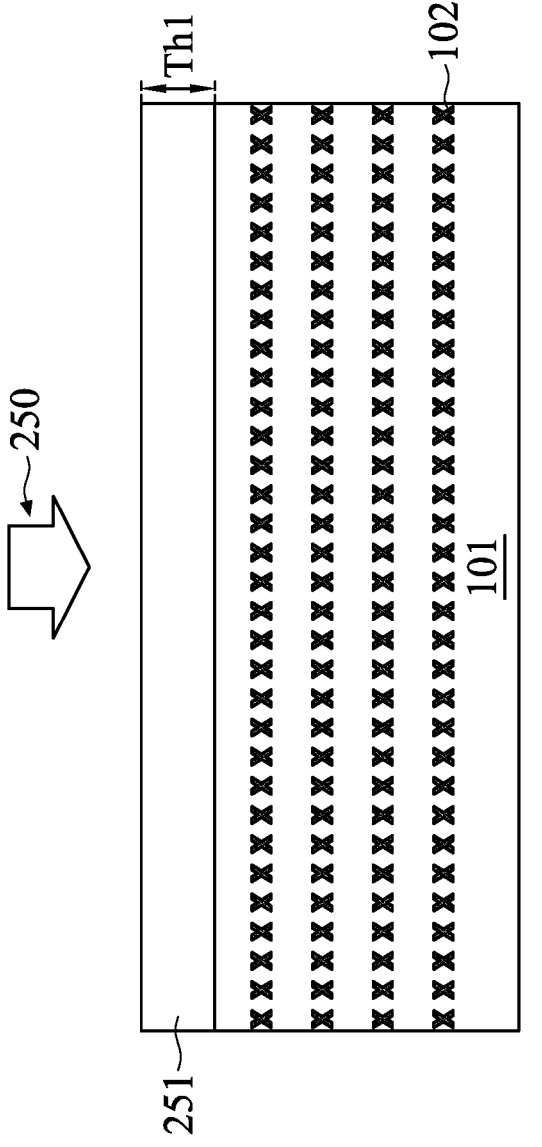
Figure 2B:
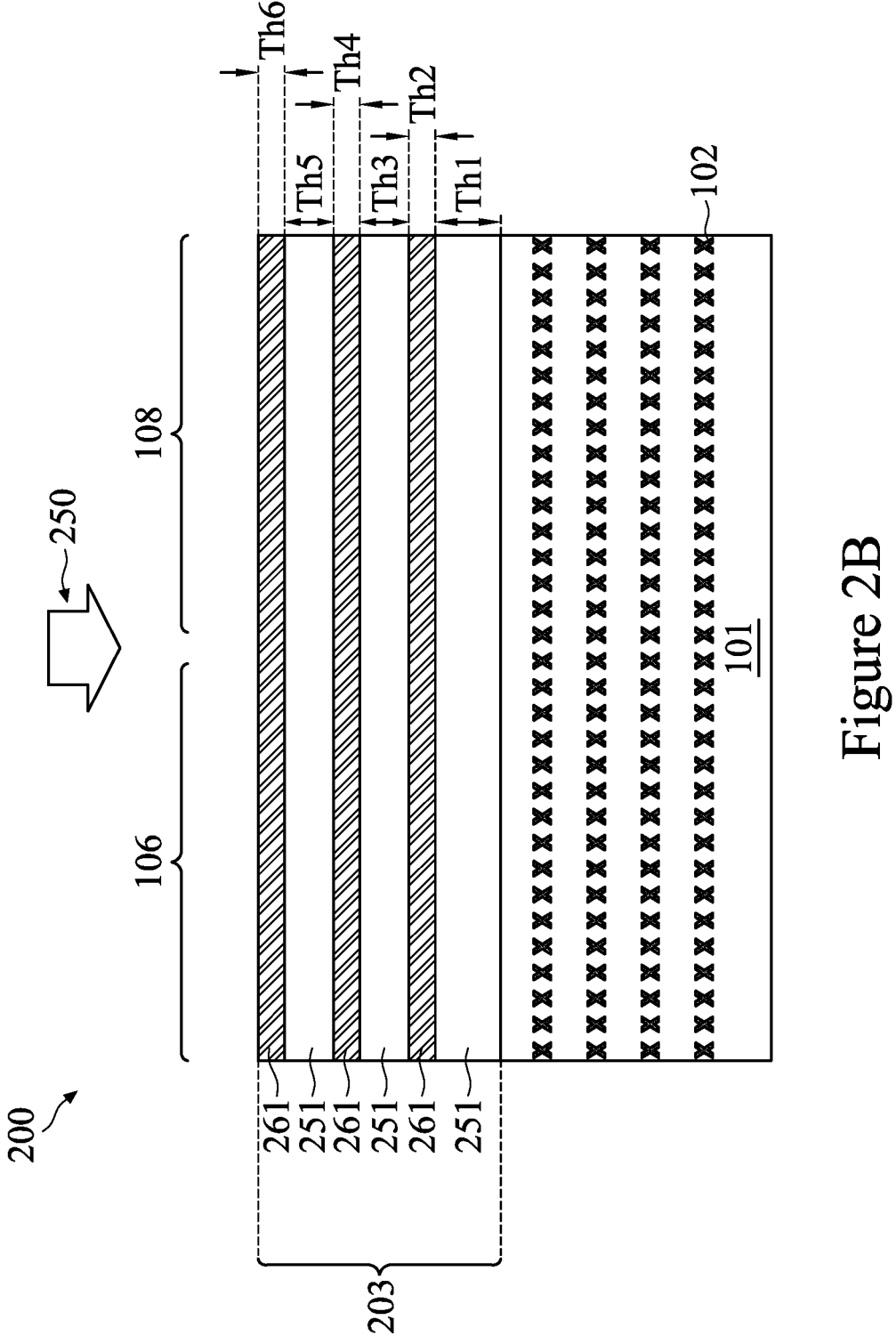

FIGS. 2A-2B are cross-sectional views of a deposition process 250, in accordance with some embodiments, to form a multi-layer structure 200 in an intermediate stage of manufacturing the gate all-around (GAA) transistor. In particular, FIG. 2A illustrates a deposition process of forming a first layer 251 of semiconductor material with a first lattice constant, such as SiGe, Ge, Si, GaAs, InSb, GaSb, InAlAs, InGaAs, GaSbP, GaAsSb, combinations of these, or the like. In some embodiments, the first layer 251 is epitaxially grown on the substrate 101 using a deposition technique such as epitaxial growth, vapor-phase epitaxy (VPE), molecular beam epitaxy (MBE), although other deposition processes, such as chemical vapor deposition (CVD), low pressure CVD (LPCVD), atomic layer CVD (ALCVD), ultrahigh vacuum CVD (UHVCVD), reduced pressure CVD (RPCVD), a combination thereof, or the like, may also be utilized.

According to some embodiments, the first layer 251 is formed to a thickness that is sufficient to help prevent the diffusion of the APT dopants 102 from the substrate 101 from reaching overlying layers (e.g., a second layer 261, described further below with respect to FIG. 2B). In some embodiments the first layer 251 is formed to a first thickness Th1 of between about 6 nm and about 20 nm, such as about 14 nm. However, any suitable thickness may be utilized while remaining within the scope of the embodiments.

Turning to FIG. 2B, this figure illustrates a continuation of the deposition process 250 to form the multi-layer structure 200 in an intermediate stage of manufacturing Gate All-Around (GAA) transistors, in accordance with an embodiment. Once the first layer 251 has been formed over the substrate 101, a series of depositions are performed to form a multi-layer stack 203 of alternating materials of the first layer 251 and the second layer 261 over the substrate 101. The second layer 261 may be a second semiconductor material such as Si, SiGe, Ge, GaAs, InSb, GaSb, InAlAs, InGaAs, GaSbP, GaAsSb, combinations of these, or the like, with a different lattice constant than the material of the first layer 251. In a particular embodiment in which the first layer 251 is silicon germanium, the second layer 261 is a material with a different lattice constant, such as silicon. However, any suitable combination of materials may be utilized.

In some embodiments, the second layer 261 is epitaxially grown on the first layer 251 using a deposition technique such as epitaxial growth, vapor-phase epitaxy (VPE), molecular beam epitaxy (MBE), although other deposition processes, such as chemical vapor deposition (CVD), low pressure CVD (LPCVD), atomic layer CVD (ALCVD), ultrahigh vacuum CVD (UHVCVD), reduced pressure CVD (RPCVD), a combination thereof, or the like, may also be utilized. The second layer 261 is formed to a second thickness Th2. However, because the second thickness Th2 is not utilized to help prevent diffusion of the APT dopants 102, the second thickness Th2 may be formed to a smaller thickness than the first thickness Th1. As such, in some embodiments the second thickness Th2 is between about 5 nm and about 12 nm, such as about 8 nm. However, any suitable material and any suitable thickness may be used.

Once the second layer 261 has been formed over the first layer 251, the deposition process 250 is repeated to form the remaining material layers in the series of alternating materials of the first layer 251 and the second layer 261 until a desired topmost layer of the multi-layer stack 203 has been formed. In a particular embodiment another first layer 251 is formed to a third thickness Th3, another second layer 261 is formed to a fourth thickness Th4, another first layer 251 is formed to a fifth thickness Th5, and another second layer 261 is formed to a sixth thickness Th6. According to the present embodiment, the topmost layer of the multi-layer stack 203 is formed as a second layer 261; however, in other embodiments, the topmost layer of the multi-layer stack 203 may be formed as a first layer 251. Additionally, although embodiments are disclosed herein comprising three first layers 251 and three second layers 261, the multi-layer stack 203 may have any suitable number of layers (e.g., nanosheets). For example, the multi-layer stack 203 may comprise multiple nanosheets in a range between 2 to 10 nanosheets. In some embodiments, the multi-layer stack 203 may comprise equal numbers of first layers 251 to second layers 261; however, in other embodiments, the number of first layers 251 may be different from the number of second layers 261.

Furthermore, the material layers of the multi-layer stack 203 may be formed to any suitable thicknesses In some embodiments, the first layers 251 (other than the first layer 251 adjacent to the substrate 101) may be formed to substantially the same thicknesses (e.g., the third thickness Th3 and the fifth thickness Th5 may be equal to each other); although, they may also be formed to different thicknesses. Furthermore, according to some embodiments, the second layers 261 may be formed to substantially the same thicknesses (e.g., the second thickness Th2, the fourth thickness Th4, and the sixth thickness Th6 may be equal to each other); although, they may also be formed to different thicknesses. In some embodiments, the thicknesses of the first layers 251 may be different from the thicknesses of the second layers 261. In other embodiments, the thickness of the first layers 251 (other than the first layer 251 adjacent to the substrate 101) may be different from the thicknesses of the second layers 261.

FIG. 2B, according to some embodiments, further illustrates that the bottommost layer of the multi-layer stack 203 is one of the first layers 251 and is formed to be the thickest of all of the layers in the multi-layer stack 203. For example, the thickness of the bottommost layer of the multi-layer stack 203 is greater than the thickness of the remaining layers of the multi-layer stack 203 (e.g., the first thickness Th1>the second thickness Th2, the third thickness Th3, the fourth thickness Th4, the fifth thickness Th5 and the sixth thickness Th6). FIG. 2B, in accordance with some embodiments, further illustrates that the thicknesses of the remaining ones of the first layers 251 are about the same thickness (e.g., the third thickness Th3~the fifth thickness Th5) and the thicknesses of the second layers 261 are about the same thickness (e.g., the second thickness Th2~the fourth thickness Th4~the sixth thickness Th6).

For example, in an embodiment in which the first layers 251 are silicon germanium and the second layers 261 are silicon, the bottommost layer of the multi-layer stack 203 is formed to the first thickness Th1, which is between about 1.1 times to about 2 times thicker than the thicknesses of the remaining ones of the first layers 251 (e.g., the third thickness Th3 and the fifth thickness Th5) of the multi-layer stack 203. Furthermore, each of the thicknesses of the remaining ones of the first layers 251 (e.g., the third thickness Th3 and the fifth thickness Th5) of the multi-layer stack 203 may be about the same thickness, for example, between about 5 nm and about 12 nm, such as about 8 nm, in accordance with some embodiments. Continuing with the example, each of the thicknesses of the second layers 261 (e.g., the second thickness Th2, the fourth thickness Th4, and the sixth thickness Th6) of the multi-layer stack 203 may the same thickness, for example, between about 5 nm and about 10 nm, such as about 7 nm, in accordance with some embodiments.

Additionally, as described above, the well implantations and APT implantation process 150 are performed prior to the epitaxial formation of the multi-layer stack 203. In other embodiments, the epitaxial formation of the multi-layer stack 203 is formed prior to performing the well implantations and APT implantation process 150. Any suitable combination of processes may be utilized to form the multi-layer stack 203 and perform the well implantations and the APT implantation process 150 may be used, and all such combinations are fully intended to be included within the scope of the embodiments.

Figure 3:
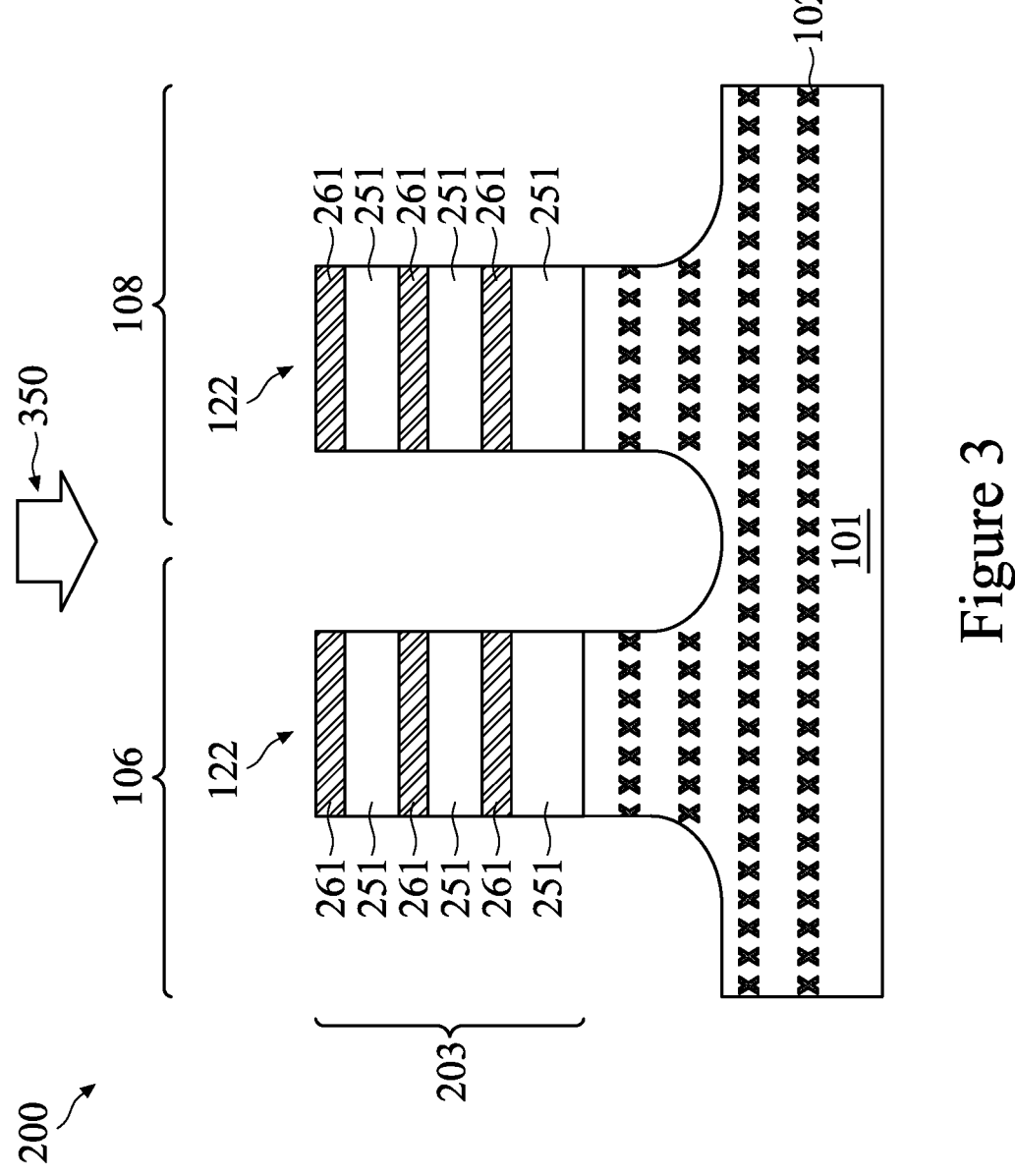

With reference now to FIG. 3, there is illustrated a patterning process 350 of the multi-layer structure 200 in an intermediate stage of manufacturing Gate All-Around (GAA) transistors, in accordance with some embodiments. In an embodiment the multi-layer stack 203 is formed from semiconductor materials that can work with the substrate 101 to help form nanostructures (e.g., nanosheets, nanowires, or the like) for the Gate All-Around (GAA) transistors. In an embodiment, the patterning process 350 comprises applying a photoresist over the multi-layer stack 203 and then patterning and developing the photoresist to form a mask over the multi-layer stack 203. Once formed, the mask is then used during an etching process, such as an anisotropic etching process to transfer the pattern of the mask into the underlying layers and form fins 122 in the multi-layer structure 200.

Additionally, while a single mask process has been described, this is intended to be illustrative and is not intended to be limiting, as the gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Figure 4:
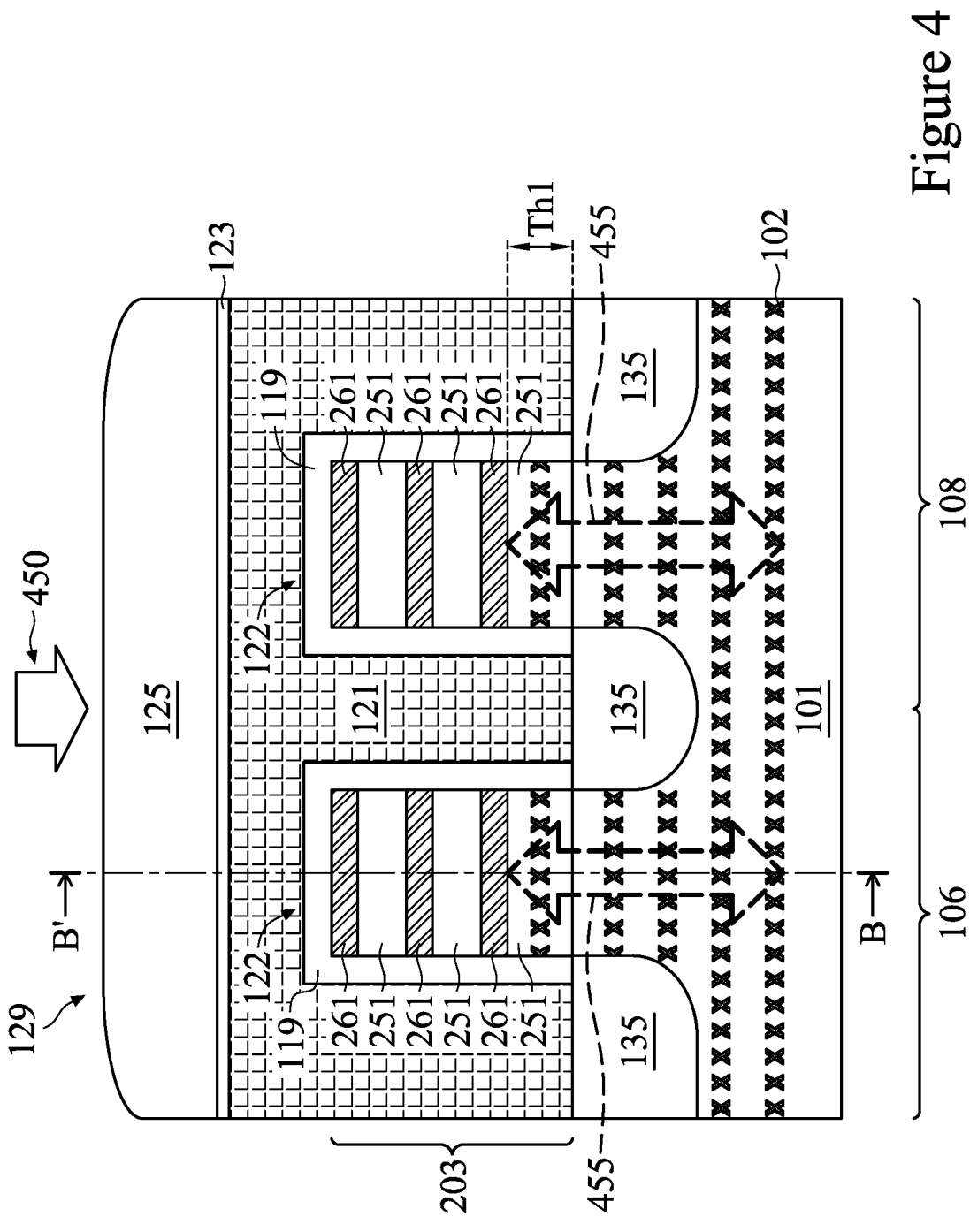

Turning to FIG. 4, after the formation of the fins 122, first isolation regions 135 are formed. In an embodiment the first isolation regions 135 may be shallow trench isolation regions formed by depositing a dielectric material such as an oxide material (e.g., a flowable oxide), high-density plasma (HDP) oxide, or the like. The dielectric material may be formed, after an optional cleaning and lining, using either a chemical vapor deposition (CVD) method (e.g., the HARP process), a high density plasma CVD method, or other suitable method of formation to fill or overfill the regions around the fins 122.

According to some embodiments, in which a flowable oxide is utilized as the dielectric material of the first isolation regions 135, a post placement anneal process 450 (e.g., oxide densification process) is performed on the multi-layer structure 200 to densify the oxide material of the first isolation regions 135 and to reduce its wet etch rate. In an embodiment the post placement anneal process 450 may comprise one or more anneal processes (e.g., steam anneal, dry thermal anneal, diffusion-less anneal, diffusion anneal, or the like) can be performed in a furnace or in a rapid thermal processing (RTP) chamber. According to some embodiments, the post placement anneal process 450 comprises a steam anneal using steam ($H_2O$) or ($H_2O_2$) as an oxygen source at a process temperature in a range from about 500° C. to about 600° C. for a duration of between about 30 minutes and an hour. In another embodiment, the post placement anneal process 450 comprises a dry ("without steam") thermal anneal in which no steam is introduced and is performed as a low temperature dry thermal anneal using temperatures below about 750° C. In yet another embodiments, the dry thermal anneal is performed using an inert gas (e.g., $N_2$). According to some embodiments, the post placement anneal process 450 comprises a UV cure or a microwave anneal (MWA) process performed. However, any suitable annealing process may be utilized.

Additionally, the post placement anneal process 450 by heating the structure, will also cause APT dopants 102 to diffuse (indicated by the directional arrows labeled 455 in FIG. 4) away from the surface of the substrate 101 (e.g., dopant out diffusion) and into the first layer 251 adjacent to the substrate 101 within the multi-layer stack 203. As such, the dopant diffusion process diffuses the p-type dopants in the first device region 106 (e.g., NMOSFET) into the neighboring fin 122 and diffuses the n-type dopants in the second device region 108 (e.g., PMOSFET) into the neighboring fin 122.

FIG. 4 further illustrates that the first thickness $Th_1$ of the bottommost layer of the multi-layer stack 203 (e.g., first layer 251) allows for a large space margin for dopant out-diffusion during the diffusion. In particular, because the first thickness Th1 of the bottommost layer of the multi-layer stack 203 is so large, while the diffusion of the APT dopants 102 may cause a concentration gradient of the APT dopants 102 to form within the first layer 251 adjacent to the substrate 101, the APT dopants 102 concentration gradient does not extend into the second layer 261. As such, the second layers 261 of the first device region 106 (e.g., NMOSFET) and of the second device region 108 (e.g., PMOSFET) remain free of the APT dopants 102 implanted into the substrate 101.

Once densified, excess dielectric material may be removed through a suitable process such as chemical mechanical polishing (CMP), an etch, a combination of these, or the like. In an embodiment, the removal process removes any dielectric material that is located over the fins 122 as well, so that the removal of the dielectric material will expose the surface of the fins 122 to further processing steps.

Once the dielectric material has been deposited, the dielectric material may then be recessed away from the surface of the fins 122. The recessing may be performed to expose at least a portion of the sidewalls of the fins 122 adjacent to the top surface of the fins 122. The dielectric material may be recessed using a wet etch by dipping the top surface of the fins 122 into an etchant selective to the material of the dielectric material, although other methods, such as a reactive ion etch, a dry etch, chemical oxide removal, or dry chemical clean may be used.

As one of ordinary skill in the art will recognize, however, the steps described above may be only part of the overall process flow used to fill and recess the dielectric material. For example, lining steps, cleaning steps, annealing steps, gap filling steps, combinations of these, and the like may also be utilized to form the dielectric material. All of the potential process steps are fully intended to be included within the scope of the present embodiment.

FIG. 4 also illustrates the formation of a dummy gate dielectric 119 and a dummy gate electrode 121 over the fins 122. In an embodiment the dummy gate dielectric 119 may be formed by thermal oxidation, chemical vapor deposition, sputtering, or any other methods known and used in the art for forming a gate dielectric. Depending on the technique of gate dielectric formation, the dummy gate dielectric 119 thickness on the top may be different from the dummy dielectric thickness on the sidewall.

The dummy gate dielectric 119 may comprise a material such as silicon dioxide or silicon oxynitride with a thickness ranging from about 3 angstroms to about 100 angstroms, such as about 10 angstroms. In an embodiment the dummy gate dielectric 119 may be formed by first depositing a sacrificial layer of a material such as silicon in order to provide sidewall protection. Once the sacrificial layer has been formed the sacrificial material may be oxidized or nitridized and consumed in order to form a dielectric such as the silicon dioxide or silicon oxynitride. However, any suitable process may be utilized.

In other embodiments the dummy gate dielectric 119 may also be formed from a high permittivity (high-k) material (e.g., with a relative permittivity greater than about 5) such as lanthanum oxide ($La_2O_3$), aluminum oxide ($Al_2O_3$), hafnium oxide ($HfO_2$), hafnium oxynitride (HfON), or zirconium oxide ($ZrO_2$), or combinations thereof, with an equivalent oxide thickness of about 0.5 angstroms to about 100 angstroms, such as about 10 angstroms or less. Additionally, any combination of silicon dioxide, silicon oxynitride, and/or high-k materials may also be used for the dummy gate dielectric 119.

The dummy gate electrode 121 may comprise a conductive material and may be selected from a group comprising of polysilicon, W, Al, Cu, AlCu, Ti, TiAlN, TaC, TaCN, TaSiN, Mn, Zr, TiN, Ta, TaN, Co, Ni, combinations of these, or the like. The dummy gate electrode 121 may be deposited by chemical vapor deposition (CVD), sputter deposition, or other techniques known and used in the art for depositing conductive materials. The thickness of the dummy gate electrode 121 may be in the range of about 5 Å to about 500 Å. The top surface of the dummy gate electrode 121 may have a non-planar top surface, and may be planarized prior to patterning of the dummy gate electrode 121 or gate etch. Ions may or may not be introduced into the dummy gate electrode 121 at this point. Ions may be introduced, for example, by ion implantation techniques.

Once the dummy gate dielectric 119 and the dummy gate electrode 121 have been formed, the dummy gate dielectric 119 and the dummy gate electrode 121 may be patterned. In an embodiment the patterning may be performed by initially forming a first hard mask 123 and a second hard mask 125 over the first hard mask 123. The first hard mask 123 comprises a dielectric material such as silicon oxide, silicon nitride, titanium nitride, silicon oxynitride, combinations of these, or the like. The first hard mask 123 may be formed using a process such as chemical vapor deposition, plasma enhanced chemical vapor deposition, atomic layer deposition, or the like. However, any other suitable material and method of formation may be utilized. The first hard mask 123 may be formed to a thickness of between about 20 Å and about 3000 Å, such as about 20 Å.

The second hard mask 125 comprises a separate dielectric material such as silicon nitride, silicon oxide, titanium nitride, silicon oxynitride, combinations of these, or the like. The second hard mask 125 may be formed using a process such as chemical vapor deposition, plasma enhanced chemical vapor deposition, atomic layer deposition, or the like. However, any other suitable material and method of formation may be utilized. The second hard mask 125 may be formed to a thickness of between about 20 Å and about 3000 Å, such as about 20 Å.

Once the first hard mask 123 and the second hard mask 125 have been formed, the first hard mask 123 and the second hard mask 125 may be patterned. In an embodiment the first hard mask 123 and the second hard mask 125 may be patterned by initially placing a photoresist (not individually illustrated) over the first hard mask 123 and the second hard mask 125 and exposing the photoresist to a patterned energy source (e.g., light) in order to initiate a chemical reaction that modifies the physical properties of the exposed portions of the first photoresist. The first photoresist may then be developed by applying a first developer (also not individually illustrated) in order to utilize the modified physical properties between the exposed region and the unexposed region to selectively remove either the exposed region or the unexposed region.

Once the photoresist has been patterned, the photoresist may be used as a mask in order to pattern the underlying first hard mask 123 and the second hard mask 125. In an embodiment the first hard mask 123 and the second hard mask 125 may be patterned using, e.g., one or more reactive ion etching (RIE) processes with the photoresist as a mask.

The patterning process may be continued until the dummy gate electrode 121 is exposed beneath the first hard mask 123.

Once the first hard mask 123 and the second hard mask 125 have been patterned, the photoresist may be removed from the first hard mask 123 and the second hard mask 125. In an embodiment the photoresist may be removed utilizing, e.g., an ashing process, whereby a temperature of the photoresist is raised until the photoresist experiences a thermal decomposition and may be easily removed using one or more cleaning process. However, any other suitable removal process may be utilized.

Once the first hard mask 123 and the second hard mask 125 have been patterned, the dummy gate electrode 121 and the dummy gate dielectric 119 may be patterned in order to form a series of stacks 129. In an embodiment the dummy gate electrode 121 and the dummy gate dielectric 119 are patterned using an anisotropic etching process, such as a reactive ion etch, although any suitable process may be utilized.

Figure 5:
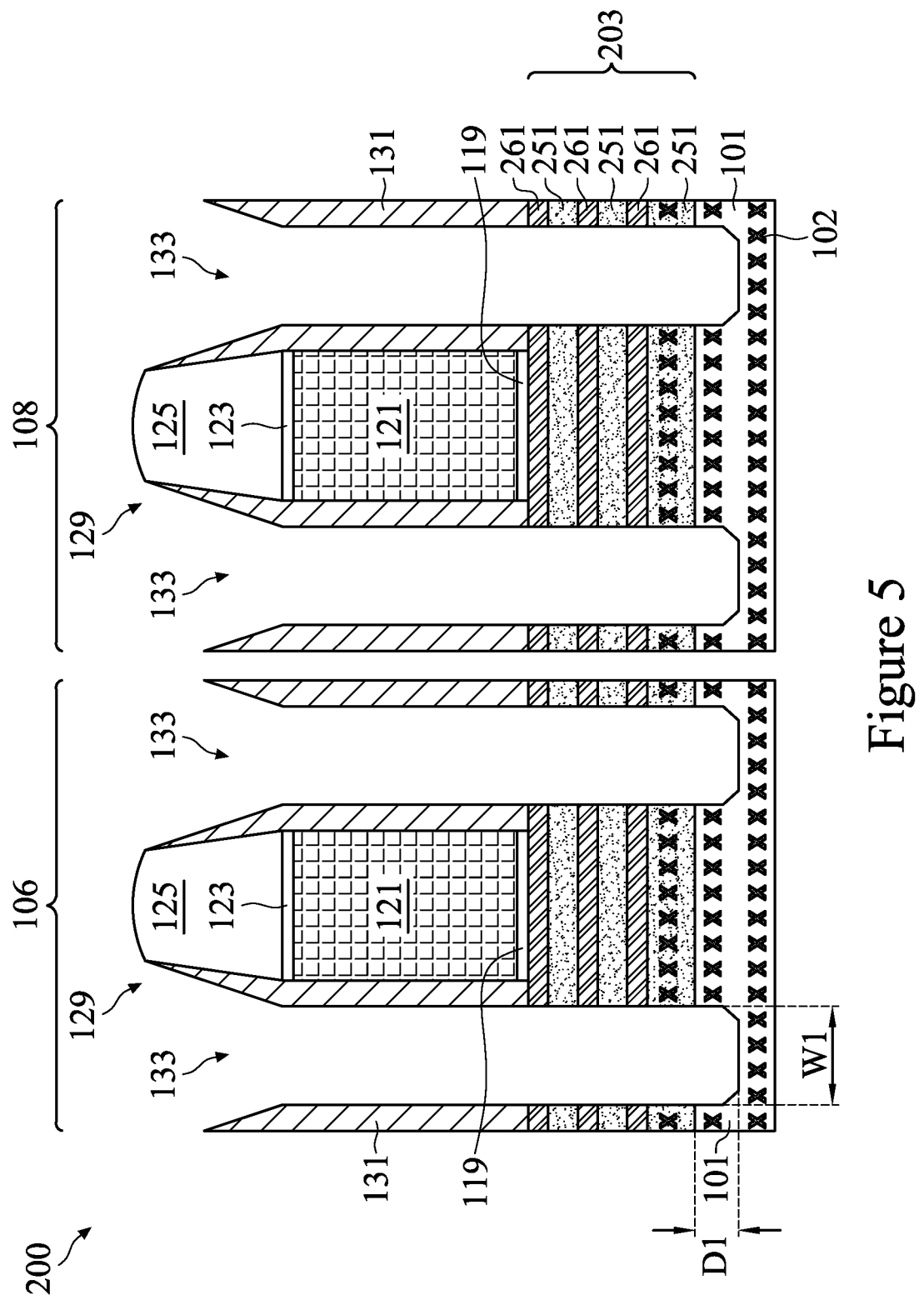

Turning to FIG. 5, this figure illustrates the cross-sectional view of the multi-layer structure 200 as taken through line B-B' of FIG. 4, in accordance with some embodiments. Additionally, while the line B-B' crosses through the first device region 106 (and, as such, the first device region 106 is illustrated in FIG. 5) for clarity a cross-sectional view of the second device region 108 is also illustrated, although the second device region 108 has been separated from the first device region 106 in FIG. 5.

FIG. 5 also illustrates the formation of first spacers 131. According to an embodiment, a first spacer dielectric layer may be formed over the dummy gate electrode 121 and the dummy gate dielectric 119. The first spacer dielectric layer may be formed on opposing sides of the stacks 129. The first spacer dielectric layer may be formed by blanket deposition on the multi-layer structure 200. The first spacer dielectric layer may comprise silicon oxide, silicon nitride, silicon oxynitride, silicon oxycarbide (SiOC), silicon oxycarbonitride (CiOCN), although any suitable material, such as low-k materials with a k-value less than about 3.5, or even an air gap, may be utilized. The first spacers 131 may be formed by methods utilized to form such a layer, such as chemical vapor deposition (CVD), plasma enhanced CVD, sputter, and any other suitable methods.

Once formed, the first spacer dielectric layer may be etched in order to form first spacers 131 on the stacks 129. In an embodiment the first spacers 131 may be formed using an anisotropic etching process such as a reactive ion etching (RIE) process. However, while the first spacers 131 are described using a single first spacer dielectric layer, this is intended to be illustrative and is not intended to be limiting. Rather, any number of layers and any combinations of deposition and removal processes may be used, and all such processes are fully intended to be included within the scope of the embodiments.

Additionally, during the formation of the first spacers 131, the multi-layer stack 203 will be re-exposed by the removal of the first spacer dielectric layer. Once exposed, FIG. 5 additionally illustrates an etching process to remove material from the multi-layer stack 203 and the substrate to form openings 133 which extend through the multi-layer stack 203 and into the substrate 101 in preparation for forming source/drain regions (described further below with respect to FIG. 7). In an embodiment the etching may be performed using one or more anisotropic etches, such as reactive ion etches, although any suitable processes may be utilized.

In an embodiment the openings 133 may be formed to have a first width W1 of between about 10 nm and about 40 nm, such as about 20 nm. Additionally, the openings 133 may be formed to extend into the substrate 101 a first depth D1 of between about 2 nm and about 30 nm, such as about 10 nm. However, any suitable dimensions may be utilized.

Figure 6:
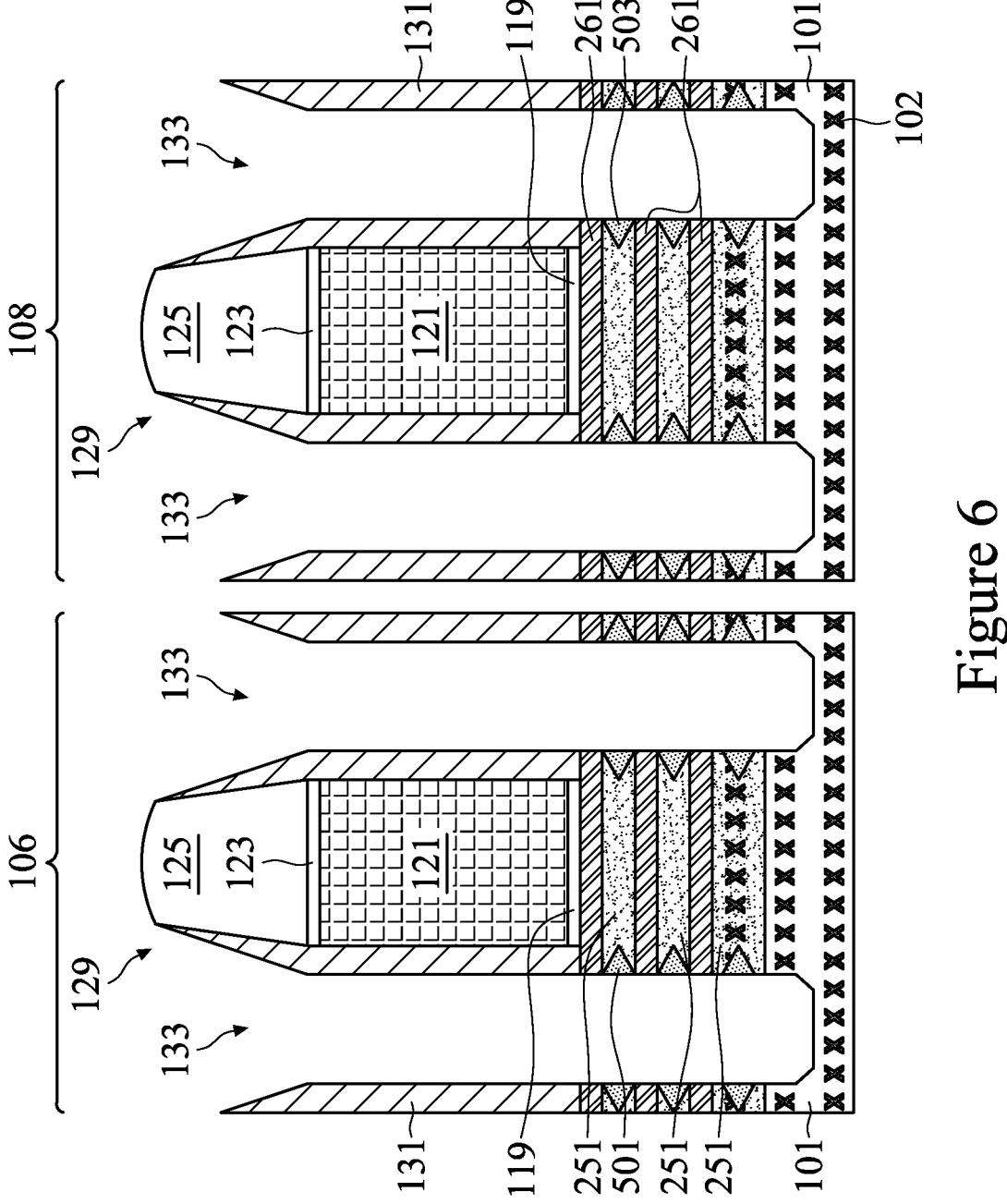

FIG. 6 illustrates formation of first inner spacers 501 in the first layers 251 of the first device region 106 and formation of second inner spacers 503 in the first layers 251 of the second device region 108. According to some embodiments, to form the first inner spacers 501 the first layers 251 are patterned using a wet etch with an etchant selective to the material of the first layers 251 (e.g., silicon germanium (SiGe)) without significantly removing the material of the second layers 261 (e.g., silicon) in the first device region 106. For example, in an embodiment in which the first layers 251 are silicon germanium and the second layers 261 are silicon, the wet etch may use an etchant such as hydrochloric acid (HCl).

In an embodiment the wet etching process may be a dip process, a spray process, a spin-on process, or the like. Additionally, the wet etching process may be performed at a temperature of between about 400° C. and about 600° C. and may be continued for a time of between about 100 seconds and about 1000 seconds, such as about 300 seconds. However, any suitable process conditions and parameters may be utilized. The etching process may be continued such that first recesses with facet limited surfaces are formed in each of the first layers 251.

However, a wet etching process is not the only process that may be utilized. For example, in another embodiment the patterning of the first layers 251 may be performed with an isotropic dry etching process or a combination of a dry etching process and a wet etching process. Any suitable process of patterning the first layers 251 may be utilized, and all such processes are fully intended to be included within the scope of the embodiments.

Once the first recesses are formed in each of the first layers 251 of the first device region 106 and in each of the first layers 251 of the second device region 108, a spacer material is formed over both the first device region 106 and the second device region 108. In an embodiment, the spacer material is a dielectric material that can be different from the material of the first spacers 131, such as silicon oxide, silicon nitride, silicon oxynitride, silicon oxycarbide (SiOC), silicon oxycarbonitride (CiOCN), although any suitable material, such as low-k materials with a k-value less than about 3.5, or even an air gap, may be utilized. The spacer material may be deposited using a deposition process such as chemical vapor deposition, physical vapor deposition, or atomic layer deposition to a thickness of between about 3 nm and about 10 nm, such as about 5 nm. However, any suitable thickness or deposition process may be utilized.

By depositing the spacer material over both the first device region 106 and the second device region 108, the spacer material will line the sidewalls of the openings 133 and also will also fill in the first recesses in the first layers 251 of the first device region 106 and the second recesses in the first layers 251 of the second device region 108. Once the first recesses within the first layers 251 have been filled with the spacer material, a removal process is then performed to remove the spacer material from the openings 133 within the first device region 106 and the openings 133 within the second device region 108, while leaving behind first inner spacers 501 in the first device region 106 and leaving behind second inner spacers 503 in the second device region 108. In an embodiment, the removal of the spacer material may be performed using an etching process such as, e.g., an aniso-tropic, dry etching process such as a reactive ion etching process. However, any suitable etching process, which removes the spacer material from the openings 133 while leaving behind the first inner spacers 501 and the second inner spacers 503, may be utilized.

As such, the first inner spacers 501 will take on the shape of the first recesses and the second inner spacers 503 will take on the shape of the second recesses. Additionally, while an embodiment forming the first inner spacers 501 and the second inner spacers 503 to a faceted shape is described, this is intended to be illustrative and is not intended to be limited. Rather, any suitable shape, such as a concave shape or a convex shape, or even the first inner spacers 501 and the second inner spacers 503 being recessed may be utilized. All such shapes are fully intended to be included within the scope of the embodiments.

Figure 7:
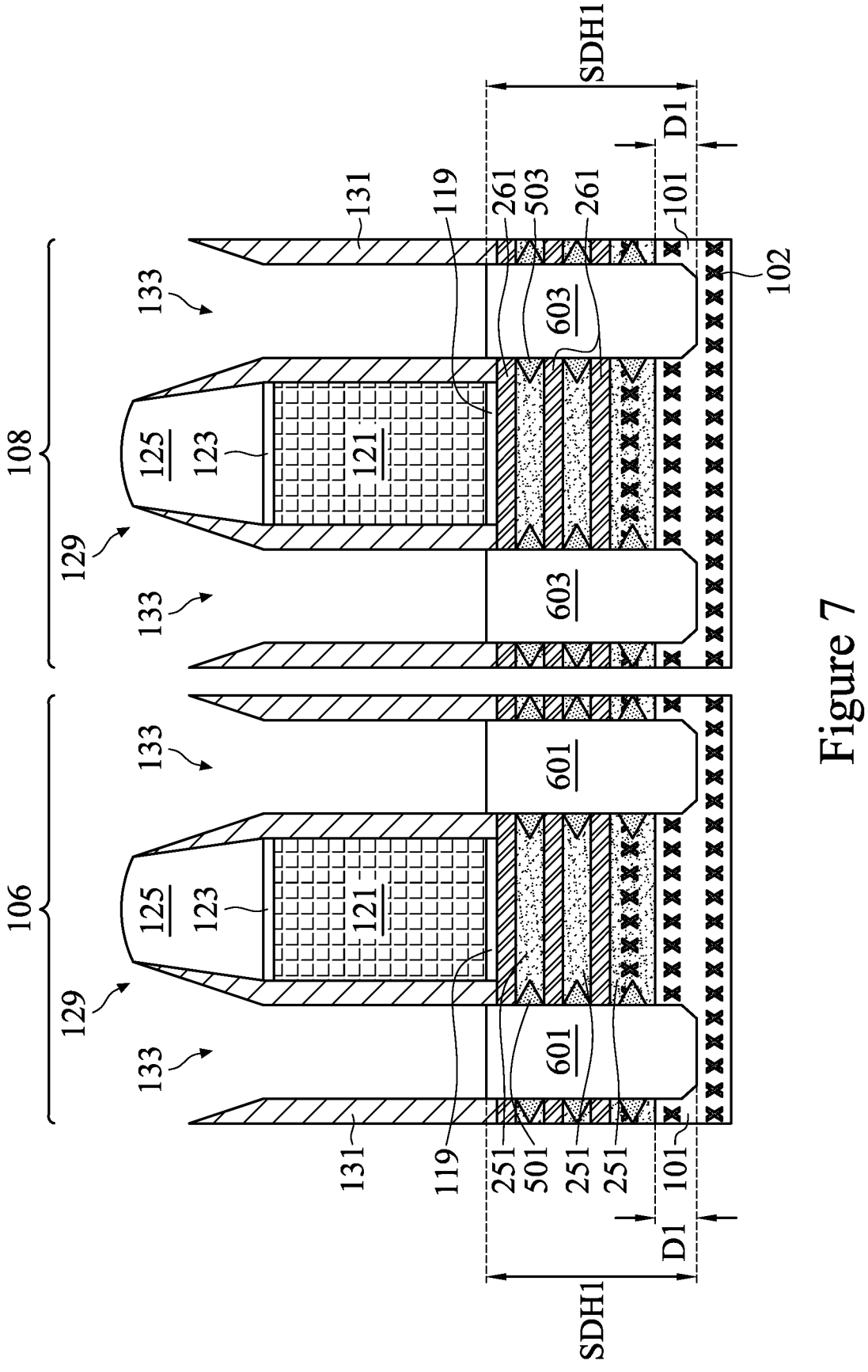

FIG. 7 illustrates a formation of first source/drain regions 601 within the first device region 106 and second source/drain regions 603 within the second device region 108. In an embodiment the first source/drain regions 601 may be formed by initially protecting the second device region 108 with, for example, a photoresist or other masking materials. Once the second device region 108 has been protected, the first source/drain regions 601 may be formed using a growth process such as a selective epitaxial process with a semi-conductor material suitable for the device desired to be formed. For example, in an embodiment in which the first source/drain regions 601 are utilized to form an NMOS device, the first source/drain regions 601 may be a semi-conductor material such as silicon, silicon phosphorous, silicon carbon phosphorous, combinations, of these, or the like. The epitaxial growth process may use precursors such as silane, dichlorosilane, germane, and the like, and may continue for between about 5 minutes and about 120 min-utes, such as about 30 minutes. According to some embodi-ments, the first source/drain regions 601 are formed to a first source/drain height SDH1 of between about 30 nm and about 90 nm, such as about 60 nm and extend into the substrate 101 the first depth D1. However, any suitable heights and/or suitable depths may be used.

Once the first source/drain regions 601 are formed, dop-ants may be implanted into the first source/drain regions 601 by implanting appropriate dopants to complement the dop-ants within the remainder of the first device region 106. For example, n-type dopants such as phosphorous (P), carbon (C), arsenic (As), silicon (Si), antimony (Sb), or the like, and combinations thereof (e.g., SiP, SiC, SiPC, SiAs, Si, Sb, etc.) may be implanted to form NMOSFET devices. These dop-ants may be implanted using the stacks 129 and the first spacers 131 as masks.

In another embodiment, the dopants of the first source/drain regions 601 may be placed during the growth of the first source/drain regions 601. For example, phosphorous may be placed in situ as the first source/drain regions 601 are being formed. Any suitable process for placing the dopants within the first source/drain regions 601 may be utilized, and all such processes are fully intended to be included within the scope of the embodiments.

Once the first source/drain regions 601 have been formed, the second source/drain regions 603 may be formed by removing the protection from the second device region 108 (through, e.g., a process such as ashing) and protecting the first device region 106 with, for example, a photoresist or other masking material. Once the first device region 106 has been protected, the second source/drain regions 603 may be formed of materials comprising silicon, silicon germanium (SiGe), silicon germanium carbon (SiGeC), germanium (Ge), or combinations thereof. The second source/drain regions 603 may be formed using a process such as epitaxial growth, although any suitable material or process may be utilized. According to some embodiments, the second source/drain regions 603 are formed to the first source/drain height SDH1 and may extend into the substrate 101 the first depth D1. However, any suitable heights and/or suitable depths may be used.

Additionally, either during the growth process or after the growth process, p-type dopants such as boron may be placed within the second source/drain regions 603. For example, the dopants may be implanted after formation using, e.g., an ion implantation process, or else may be deposited in situ with the formation of the second source/drain regions 603. Additionally, once the second source/drain regions 603 have been formed, the protection of the first device region 106 may be removed using a process such as ashing.

Figure 8:
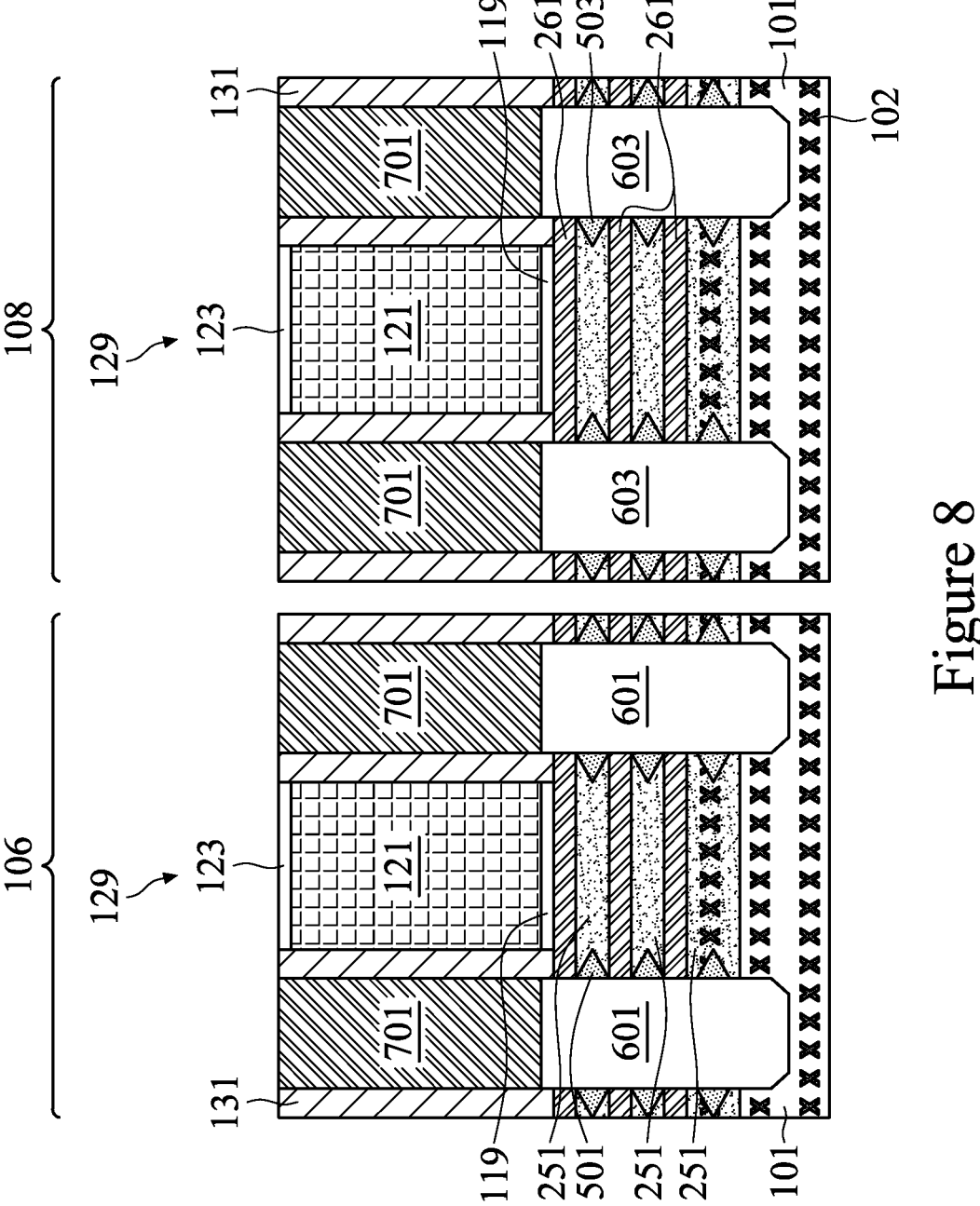

FIG. 8 illustrates a formation of an inter-layer dielectric (ILD) (e.g., ILD layer 701) over the first device region 106 and the second device region 108. The ILD layer 701 may comprise a material such as silicon dioxide, a low-k dielec-tric material (e.g., a material having a dielectric constant lower than silicon dioxide), such as silicon oxynitride, phosphosilicate glass (PSG), borosilicate glass (BSG), boro-phosphosilicate glass (BPSG), undoped silicate glass (USG), fluorinated silicate glass (FSG), organosilicate glasses (OSG), $SiO_xC_y$, Spin-On-Glass, Spin-On-Polymers, silicon carbon material, a compound thereof, a composite thereof, the like, or a combination thereof, although any suitable dielectrics may be used. The ILD layer 701 may be formed using a process such as PECVD, although other processes, such as LPCVD, may alternatively be used.

Additionally, if desired, gate end dielectrics 1325 (not illustrated in FIG. 8 but illustrated below with respect to FIG. 12A) may be formed. In an embodiment, portions of the dummy gate electrode 121 are removed using, e.g., a masking and etching process in order to cut the dummy gate electrode 121 into separate sections. Once the material has been cut, material for the gate end dielectrics 1325 such as silicon nitride, silicon oxide, titanium nitride, silicon oxyni-tride, combinations of these, or the like, is deposited and planarized in order to form the gate end dielectrics 1325 and separate the materials of the dummy gate electrode 121.

Once the ILD layer 701 has been deposited and any gate end dielectrics 1325 have been formed, the ILD layer 701 and gate end dielectrics 1325 may be planarized with the first spacers 131 using, e.g., a planarization process such as a chemical mechanical polishing process, although any suitable process may be utilized. Additionally, the planar-ization process can also remove the second hard mask 125 while stopping on the first hard mask 123.

Figure 9:
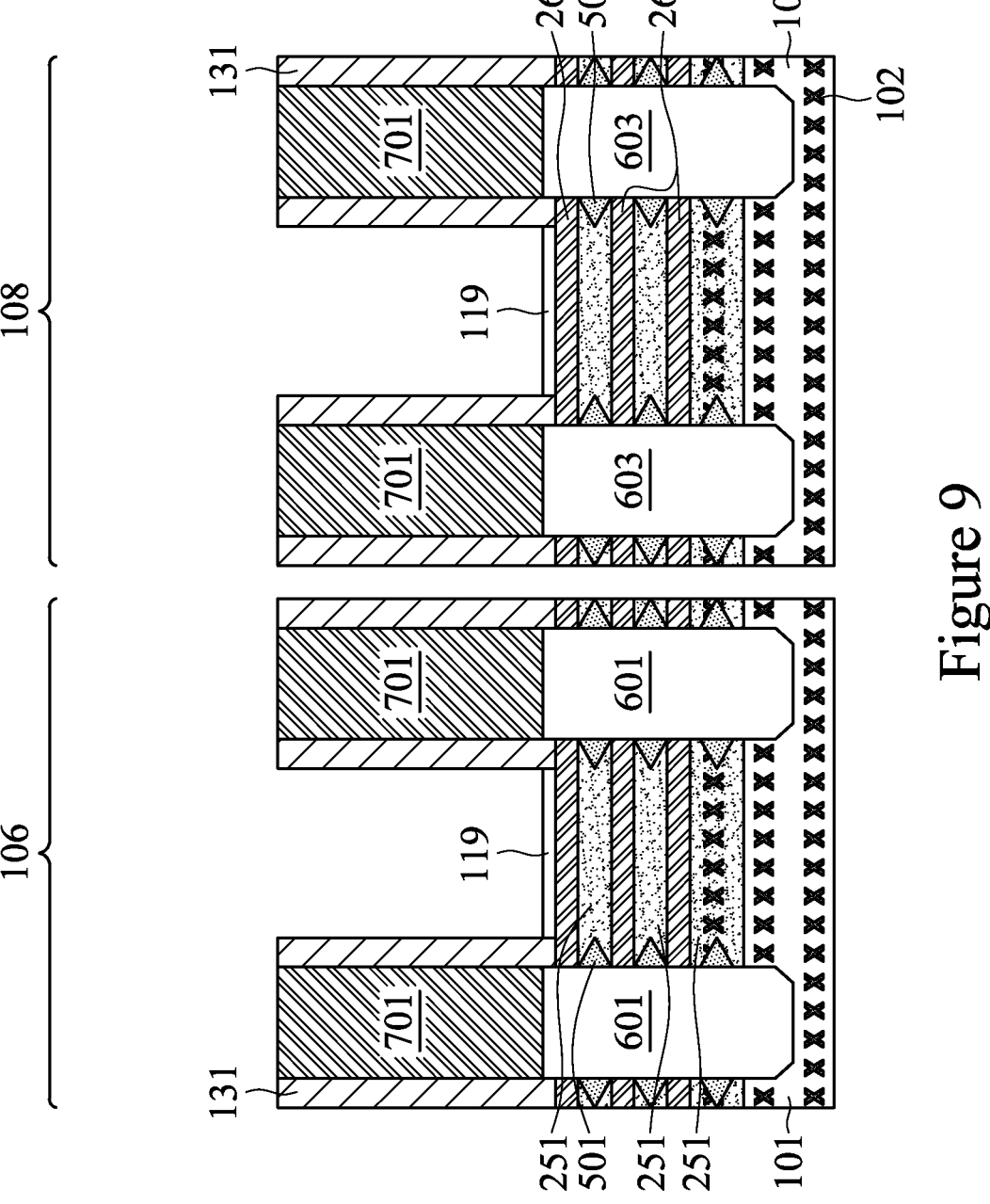

FIG. 9 illustrates a removal of the first hard mask 123 as well as a removal of the dummy gate electrode 121. In an embodiment the first hard mask 123 may be removed using an etching process or a planarization process (e.g., a con-tinuation of the previous chemical mechanical polishing process) to remove the material of the first hard mask 123. However, any suitable method of removing the first hard mask 123 to expose the material of the dummy gate elec-trode 121 may be utilized.

Once the dummy gate electrode 121 has been exposed, the dummy gate electrode 121 may be removed in order to expose the underlying dummy gate dielectric 119. In an embodiment the dummy gate electrode 121 may be removed using, e.g., one or more wet or dry etching process that utilizes etchants that are selective to the material of the dummy gate electrode 121. However, any suitable removal process may be utilized.

Figure 10A:
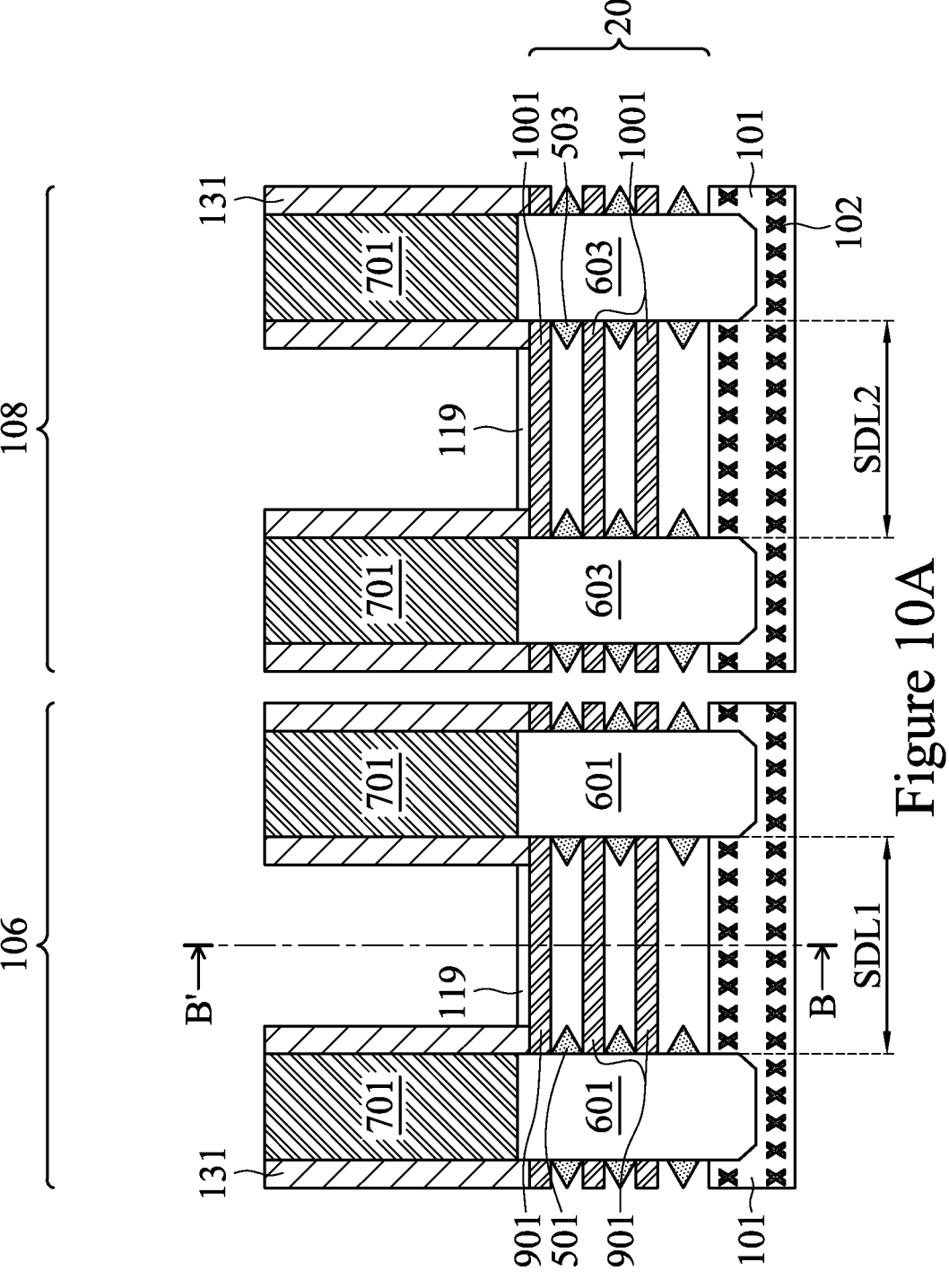

FIG. 10A illustrates that, once the dummy gate dielectric 119 has been exposed, the dummy gate dielectric 119 within the first device region 106 and the second device region 108 may be removed in a sheet release process step, a wire release process step. The wire release process step may also be referred to as a sheet formation process step, a nanosheet formation process step or a wire formation process step. In an embodiment the dummy gate dielectric 119 may be removed using, e.g., a wet etching process, although any suitable etching process may be utilized.

FIG. 10A further shows that, once the dummy gate dielectric 119 has been removed (which also exposes the sides of the first layers 251), the first layers 251 may be removed from between the substrate 101 and from between the second layers 261 within both the first device region 106 and the second device region 108. In an embodiment the first layers 251 may be removed using a wet etching process that selectively removes the material of the first layers 251 (e.g., silicon germanium (SiGe)) without significantly removing the material of the substrate 101 and the material of the second layers 261 (e.g., silicon (Si)). However, any suitable removal process may be utilized.

For example, in an embodiment in which the material of the first layers 251 is silicon germanium (SiGe) and the material of the second layers 261 is silicon, the removal of the first layers 251 may be performed using an etchant that selectively removes the material of the first layers 251 (e.g., silicon germanium) without substantively removing the material of the second layers 261 (e.g., silicon). In an embodiment, the etchant may be a high temperature HCl. Additionally, the wet etching process may be performed at a temperature of between about 400° C. and about 600° C., such as about 560° C., and for a time of between about 100 seconds and about 600 seconds, such as about 300 seconds. However, any suitable etchant, process parameters, and time can be utilized.

By removing the material of the first layers 251, the material of the second layers 261 (e.g., nanosheets) are formed into first nanostructures 901 within the first device region 106 separated from each other by the first inner spacers 501 and formed into second nanostructures 1001 within the second device region 108 separated from each other by the second inner spacers 503. The first nanostructures 901 comprise the channel regions of the first device region 106 that span a first source/drain length SDL1 between opposite ones of the first source/drain regions 601 within the first device region 106 and the second nanostructures 1001 comprise the channel regions of the second device region 108 that span a second source/drain length SDL2 between opposite ones of the second source/drain regions 603. The second source/drain length SDL2 may be the same length as the first source/drain length SDL1 or may be a different length. According to some embodiments, the first source/drain length SDL1 and the second source/drain length SDL2 have a same length between about 12 nm and about 40 nm, such as about 22 nm. However, any suitable length may be used. Furthermore, in an embodiment the first nanostructures 901 and the second nanostructures 1001 are formed to have a same or thinner thickness as the original second layers 261, such as having the second thickness Th2, the fourth thickness Th4, the sixth thickness Th6, although the etching processes may also be utilized to reduce the thicknesses.

Additionally, although FIG. 10A illustrates the formation of three of the first nanostructures 901 and three of the second nanostructures 1001, any suitable number of the first nanostructures 901 may be formed from the nanosheets provided in the multi-layer stack 203. For example, the multi-layer stack 203 may be formed to include any suitable number of first layers 251 (e.g., first nanosheets) and any suitable number of second layers 261 (e.g., second nanosheets). As such, a multi-layer stack 203 comprising fewer first layers 251 and fewer second layers 261, after removal of the first layers 251, forms one or two of the first nanostructures 901 and the second nanostructures 1001. Whereas, a multi-layer stack 203 comprising many of the first layers 251 and many of the second layers 261, after removal of the first layers 251, forms four or more of the first nanostructures 901 and the second nanostructures 1001.

Figure 10B:
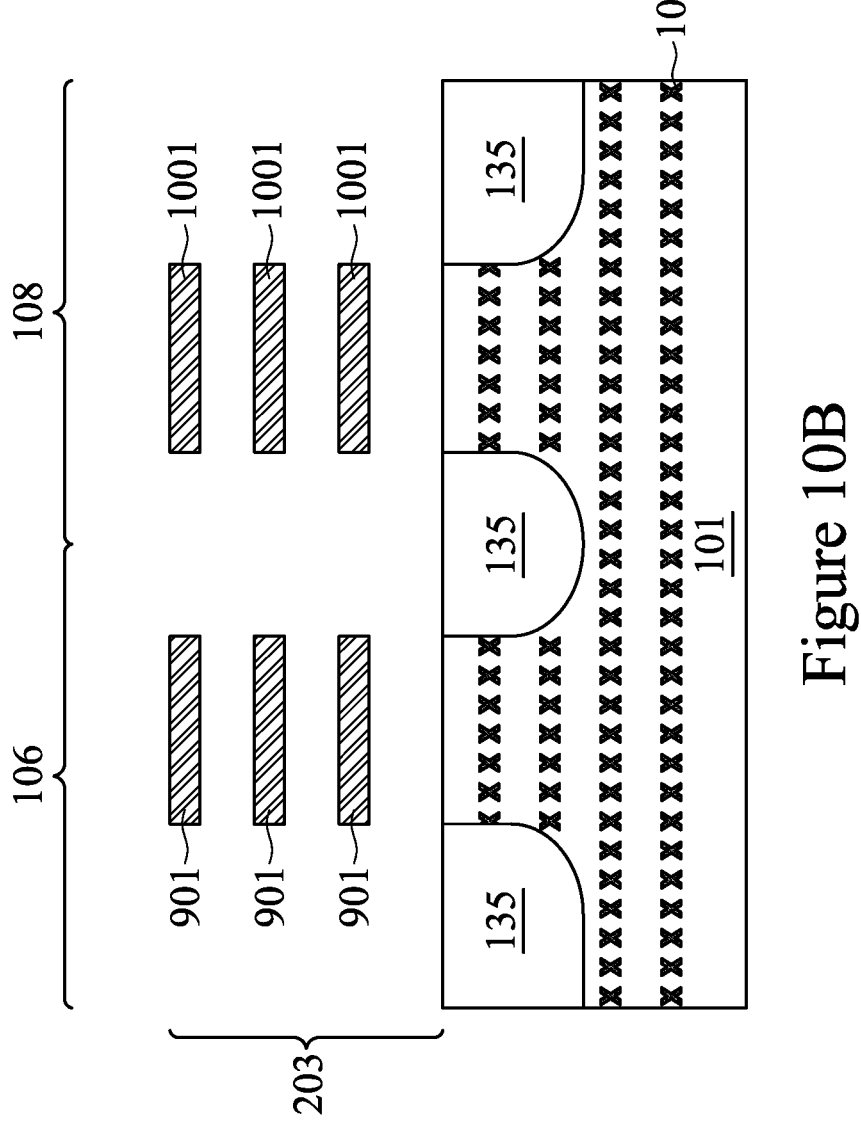

FIG. 10B illustrates a cross-sectional view of the first device region 106 along line B-B' in FIG. 10A and similar to the view of FIG. 3. As can be seen, with the removal of the dummy gate dielectric 119, the sides of the second layers 261 (relabeled within FIG. 10B to the first nanostructures 901) within the first device region 106 are exposed. As such, the first layers 251 may be exposed to the etchant and removed from between the second layers 261 in order to form the first nanostructures 901.

Figure 11:
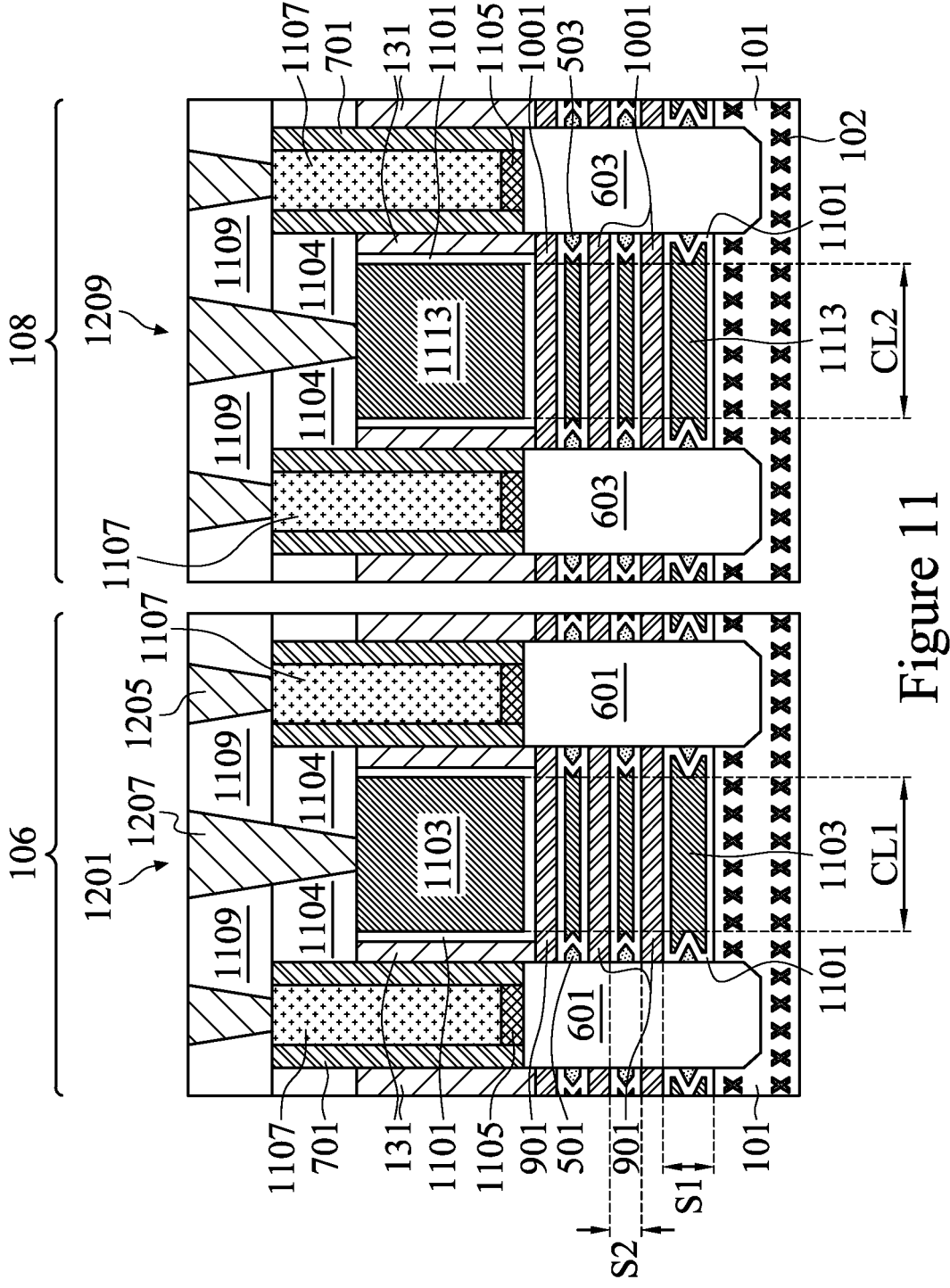

FIG. 11 illustrates the formation of gate stacks which comprise gate dielectrics and gate electrodes. For example, FIG. 11 illustrates formation of a gate dielectric 1101, a first gate electrode 1103, and source/drain contacts 1107 within the first device region 106, in accordance with some embodiments. FIG. 11 further illustrates the formation of the gate dielectric 1101, a second gate electrode 1113, and source/drain contacts 1107 formed within the second device region 108, in accordance with some embodiments.

Once the first nanostructures 901 and the second nanostructures 1001 have been formed, the gate dielectric 1101 may be formed around the first nanostructures 901 and around the second nanostructures 1001, in accordance with some embodiments. In some embodiments, an optional first interface layer (not separately illustrated) may be formed around the first nanostructures 901 in the first device region 106 and around the second nanostructures 1001 in the second device region 108, prior to the formation of the gate dielectric 1101. In some embodiments, the first interface layer comprises a buffer material such as silicon oxide, although any suitable material may be utilized. The first interface layer may be formed around the first nanostructures 901 in the first device region 106 and the second nanostructures 1001 in the second device region 108 using a process such as CVD, PVD, or even oxidation to a thickness of between about 1 Å and about 20 Å, such as about 9 Å. However, any suitable process or thicknesses may be utilized.

According to some embodiments, the thicknesses for the first nanostructures 901 and the second nanostructures 1001 are thinner than the original thicknesses of the second layers 261 (e.g., Si) by about 0.3 nm and about 2 nm. During the wire release process step and during the formation of the gate dielectric layer 1101, the thicknesses of each of the second layers 261 may experience some Si material loss and/or oxidation. As such, each of the first nanostructures 901 and the second nanostructures 1001 and, hence the channel regions of the first device region 106 and the second device region 108, are formed to a same thickness of between about 4 nm and about 8 nm, such as about 6 nm.

In an embodiment the gate dielectric 1101 is a high-k material such as $HfO_2$, HfSiO, HfSiON, HfTaO, HfTiO, HfZrO, LaO, ZrO, TiO, $Ta_2O_5$, $Al_2O_3$, combinations of these, or the like, deposited through a process such as atomic layer deposition, chemical vapor deposition, or the like. In some embodiments a nitrogen doped dielectric may be initially formed prior to forming the metal content material The gate dielectric 1101 may be deposited to a thickness of between about 1 nm and about 3 nm, although any suitable material and thickness may be utilized. As illustrated, the gate dielectric 1101 wraps around the first nanostructures 901 and the second nanostructures 1001, thus forming channel regions of the first device region 106 and the second device region 108, respectively.

FIG. 11 further illustrates that the first gate electrode 1103 is formed to surround the first nanostructures 901 within the first device region 106, and that the second gate electrode 1113 is formed to surround the second nanostructures 1001 within the second device region 108. In an embodiment the first gate electrode 1103 and the second gate electrode 1113 may be formed using multiple layers, each layer deposited sequentially adjacent to each other using a highly conformal deposition process such as atomic layer deposition, although any suitable deposition process may be utilized. In one embodiment, the first gate electrode 1103 may comprise a capping layer, a barrier layer, an n-metal work function layer, a p-metal work function layer, and a fill material.

The capping layer may be formed adjacent to the gate dielectric 1101 and may be formed from a metallic material such as TaN, Ti, TiAlN, TaC, TaCN, TaSiN, Mn, Zr, TiN, Ru, Mo, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like. The metallic material may be deposited using a deposition process such as atomic layer deposition, chemical vapor deposition, or the like, although any suitable deposition process may be used.

The barrier layer may be formed adjacent the capping layer, and may be formed of a material different from the capping layer. For example, the barrier layer may be formed of a material such as one or more layers of a metallic material such as TiN, TaN, Ti, TiAlN, TaC, TaCN, TaSiN, Mn, Zr, Ru, Mo, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like. The barrier layer may be deposited using a deposition process such as atomic layer deposition, chemical vapor deposition, or the like, although any suitable deposition process may be used.

The n-metal work function layer may be formed adjacent to the barrier layer. In an embodiment the n-metal work function layer is a material such as W, Cu, AlCu, TiAlC, TiAlN, Ti, TiN, Ta, TaN, Co, Ni, Ag, Al, TaAl, TaAlC, TaC, TaCN, TaSiN, Mn, Zr, other suitable n-type work function materials, or combinations thereof. For example, the first n-metal work function layer may be deposited utilizing an atomic layer deposition (ALD) process, CVD process, or the like. However, any suitable materials and processes may be utilized to form the n-metal work function layer.

The p-metal work function layer may be formed adjacent to the n-metal work function layer. In an embodiment, the first p-metal work function layer may be formed from a metallic material such as W, Al, Cu, TiN, Ti, TiAlN, Ta, TaN, Co, Ni, TaC, TaCN, TaSiN, $TaSi_2$, $NiSi_2$, Mn, Zr, $ZrSi_2$, TaN, Ru, AlCu, Mo, $MoSi_2$, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like. Additionally, the p-metal work function layer may be deposited using a deposition process such as atomic layer deposition, chemical vapor deposition, or the like, although any suitable deposition process may be used.

Once the p-metal work function layer has been formed, the fill material is deposited to fill a remainder of the opening. In an embodiment the fill material may be a material such as tungsten, Al, Cu, AlCu, W, Ti, TiAlN, TaC, TaCN, TaSiN, Mn, Zr, TiN, Ta, TaN, Co, Ni, combinations of these, or the like, and may be formed using a deposition process such as plating, chemical vapor deposition, atomic layer deposition, physical vapor deposition, combinations of these, or the like. However, any suitable material may be utilized.

Similarly, the second gate electrode 1113 may be formed using multiple layers. In an embodiment the second gate electrode 1113 may be formed using the capping layer, the barrier layer adjacent to the capping layer, the p-metal work function layer adjacent to the barrier layer, the n-metal work function layer adjacent to the p-metal work function layer, and the fill material. According to some embodiments, one or more of the layers within the first gate electrode 1103 and the second gate electrode 1113 may be formed during a same series of steps. For example, the capping layers and the barrier layers in both of the first gate electrode 1103 and the second gate electrode 1113 may be formed simultaneously, while other layers such as the n-metal work function layer and the p-metal work function layer may be formed and/or patterned independently of each other. Any suitable combination of depositions and removals may be utilized to form the first gate electrode 1103 and the second gate electrode 1113.

Once the openings left behind by the removal of the dummy gate electrode 121 have been filled, the materials of the first gate electrode 1103 and the second gate electrode 1113 may be planarized in order to remove any material that is outside of the openings left behind by the removal of the dummy gate electrode 121. In a particular embodiment the removal may be performed using a planarization process such as chemical mechanical polishing. However, any suitable planarization and removal process may be utilized.

By utilizing the embodiments herein, any APT dopants 102 that may have diffused out of the substrate 101 make it no further than first layer 251, which is subsequently removed and replaced by the gate stack comprising the gate dielectric 1101 and the first gate electrode 1103. As such, the gate stack of the gate dielectric 1101 and the first gate electrode 1103 (including any interfacial layers), have a first sheet distance S1 adjacent to the substrate 101 that is equal to the original thickness of the first layer 251 that was adjacent to the substrate 101, such as the first thickness Th1 of between about 6 nm and about 20 nm. Additionally, the gate stack of the gate dielectric 1101 and the first gate electrode 1103 that is located between different first nanostructures 901 (e.g., between two first nanostructures 901 that are not located adjacent to the substrate 101) will have a second sheet distance S2 that is smaller than the first sheet distance S1. In an embodiment the second sheet distance S2 will be equal to the original thickness of the first layers 251, such as by being between about 5 nm and about 12 nm, such as about 10 nm. Finally, in some embodiments, a first ratio of the first sheet distance S1 to the second sheet distance S2 (e.g., R1=S1:S2) is between about 1.1:1.0 and about 2.0:1.0, such as about 1.2:1.0. However, any suitable ratio may be utilized.

Finally, the first nanostructures 901 and, hence the channels of the NMOS device, and the second nanostructures 1001 and, hence the channels of the PMOS device, are formed from the second layers 261. As such, each of the first nanostructures 901 and the second nanostructures 1001 may have the thickness of the original second layers 261, such as the second thickness Th2, the fourth thickness Th4, and the sixth thickness Th6. As such, the first nanostructures 901 and the second nanostructures 1001 may be formed to have a thickness of between about 4 nm and about 8 nm. However, any suitable dimensions may be utilized.

Additionally, the first nanostructures 901, after formation of the first source/drain regions 601, may have a first channel length CL1 and the second nanostructures 1001, after formation of the second source/drain regions 603, may have a second channel length CL2. In some embodiments, the second channel length CL2 is different from the first channel length CL1, although they may also be the same. According to some embodiments, the first channel length CL1 and the second channel length CL2 are the same length of between about 3 nm and about 30 nm, such as about 12 nm. However, any suitable lengths may be utilized.

According to some embodiments, once the first gate electrode 1103 and the second gate electrode 1113 have been formed, the materials of the first gate electrode 1103, the second gate electrode 1113, and the first spacers 131 may be recessed below the planarized surfaces of the ILD layer 701. Once recessed, a dielectric capping layer 1104 may be formed within the recesses and then planarized with the ILD layer 701. In an embodiment the dielectric capping layer 1104 may be a dielectric material such as a silicon nitride layer or a high-k dielectric layer formed using a deposition process such as CVD, ALD, PVD, combinations of these, or the like. Once formed, the dielectric capping layer 1104 may be planarized using a planarization process such as a chemical mechanical polishing process.

FIG. 11 also illustrates that, once the first gate electrode 1103 has been formed, silicide contacts 1105 and source/drain contacts 1107 may be formed through the ILD layer 701 to make electrical connection to the first source/drain regions 601 in the first device region 106 and the second source/drain regions 603 in the second device region 108. In an embodiment the silicide contacts 1105 and the source/drain contacts 1107 may be formed by initially forming openings through the ILD layer 701 in order to expose the first source/drain regions 601 in the first device region 106 and the second source/drain regions 603 in the second device region 108. The openings may be formed using, e.g., a suitable photolithographic masking and etching process.

The silicide contacts 1105 may comprise titanium, nickel, cobalt, or erbium in order to reduce the Schottky barrier height of the source/drain contacts 1107. However, other metals, such as platinum, palladium, and the like, may also be used. The silicidation may be performed by blanket deposition of an appropriate metal layer, followed by an annealing step which causes the metal to react with the underlying exposed silicon. Un-reacted metal is then removed, such as with a selective etch process. The thickness of the silicide contacts 1105 may be between about 5 nm and about 50 nm.

In an embodiment the source/drain contacts 1107 may be a conductive material such as Al, Cu, W, Co, Ti, Ta, Ru, TiN, TiAl, TiAlN, TaN, TaC, NiSi, CoSi, combinations of these, or the like, although any suitable material may be deposited into the openings using a deposition process such as sputtering, chemical vapor deposition, electroplating, electroless plating, or the like, to fill and/or overfill the openings. Once filled or overfilled, any deposited material outside of the openings may be removed using a planarization process such as chemical mechanical polishing (CMP). However, any suitable material and process of formation may be utilized.

Once the source/drain contacts 1107 have been formed, a second ILD layer 1109 may be formed by depositing a dielectric material over the first device region 106 and the second device region 108. The second ILD layer 1109 may be formed and planarized using any of the processes and materials suitable for forming the ILD layer 701, as set forth above.

Additionally, after formation, source/drain vias 1205 and gate vias 1207 may be formed through the second ILD layer 1109 and the dielectric capping layer 1104 to provide electrical connectivity. In an embodiment the source/drain vias 1205 and the gate vias 1207 may be utilized by initially forming an opening through the second ILD layer 1109 and the dielectric capping layer 1104 using, e.g., a masking and etching process. Once the openings have been formed, conductive material, such as copper, may be deposited to fill and/or overfill the openings using a deposition process such as plating, chemical vapor deposition, sputtering, combinations of these, or the like. Excess material may then be removed using, for example, a planarization process such as chemical mechanical planarization, or the like.

By forming and utilizing the first nanostructures 901 within the first device region 106 and the second nanostructures 1001 within the second device region 108, high performance may be achieved with short channel devices. For example, according to some embodiments, the GAA transistors are formed with a guard band for preventing diffusion of APT doping into the channel region. In some embodiments, the GAA transistors are formed with shallow source/drain depths. As such, the GAA transistors are formed to mitigate issues that may be induced by anti-punch through (APT) doping diffusion during fabrication of gate all-around (GAA) transistors, such as bottom sheet threshold voltage (Vt) shift, junction leakage, APT dopant out-diffusion, well proximity effect, and APT implant contamination in the channel region.

Figure 12A:
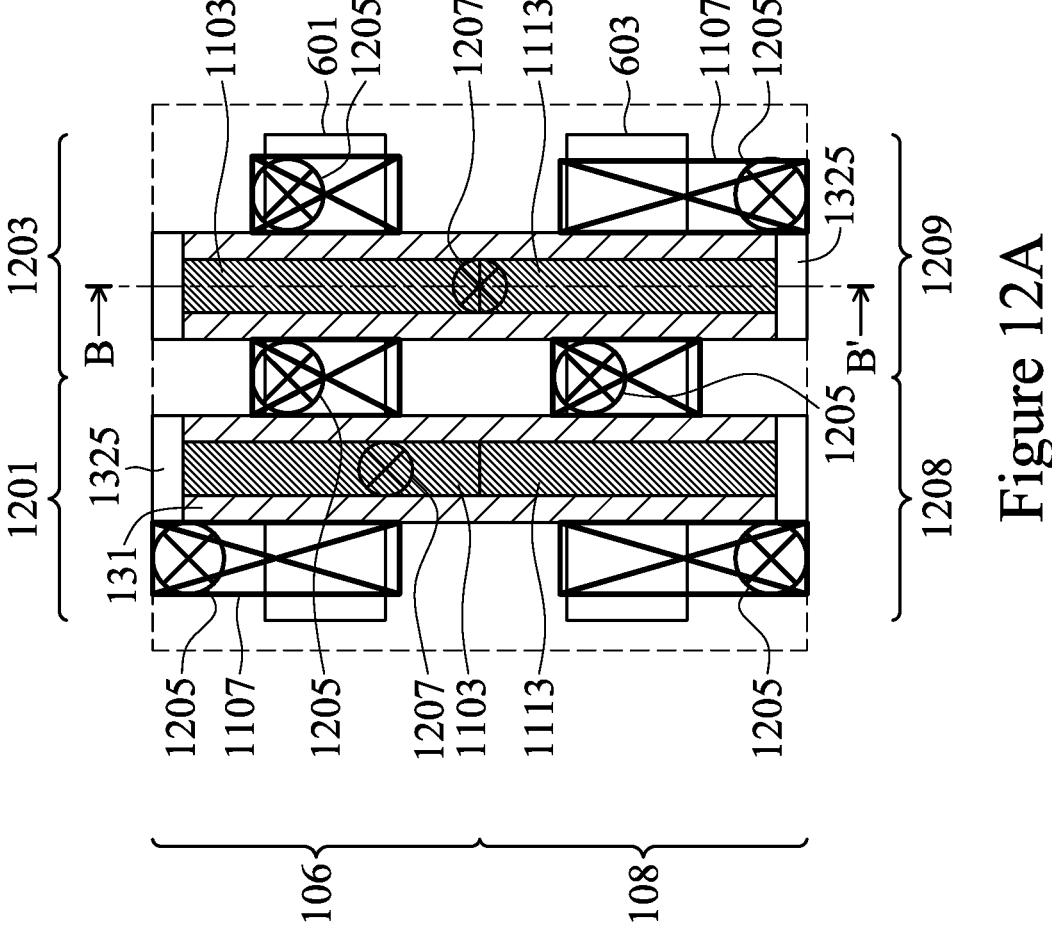
FIG. 12A illustrates a physical layout of the semiconductor device comprising a set of GAA transistors, in accordance with some embodiments.

FIG. 12A illustrates a top down view of one embodiment of NMOS gate all around transistors formed together with PMOS gate all around transistors. In an embodiment the first device region 106 is utilized to form a first NMOS gate all around transistor 1201 and a second NMOS gate all around transistor 1203. Both the first NMOS gate all around transistor 1201 and the second NMOS gate all around transistor 1203 utilize the same combination of first nanostructures 901 and first source/drain regions 601, with multiple ones of the first gate electrode 1103 formed over the same combination of the first nanostructures 901 and the first source/drain regions 601. In these views, however, the first nanostructures 901 are covered by the first gate electrodes 1103, so the first nanostructures 901 are not visible. Additionally, the source/drain contacts 1107 are formed to make electrical connection with each of the first source/drain regions 601 within the first device region 106 and source/drain vias 1205 and gate vias 1207 are formed to provide electrical connectivity.

Within the second device region 108, the second device region 108 is utilized to form a first PMOS gate all around transistor 1208 and a second PMOS gate all around transistor 1209. Both the first PMOS gate all around transistor 1208 and the second PMOS gate all around transistor 1209 utilize the same combination of second nanostructures 1001 and second source/drain regions 603, with multiple ones of the second gate electrode 1113 formed over the same combination of the second nanostructures 1001 and the second source/drain regions 603. In these views, however, the second nanostructures 1001 are covered by the second gate electrodes 1113, so the second nanostructures 1001 are not visible. Additionally, the source/drain contacts 1107 are formed to make electrical connection with each of the second source/drain regions 603 within the second device region 108 and the source/drain vias 1205 and the gate vias 1207 are formed to provide electrical connectivity.

Figure 12B:
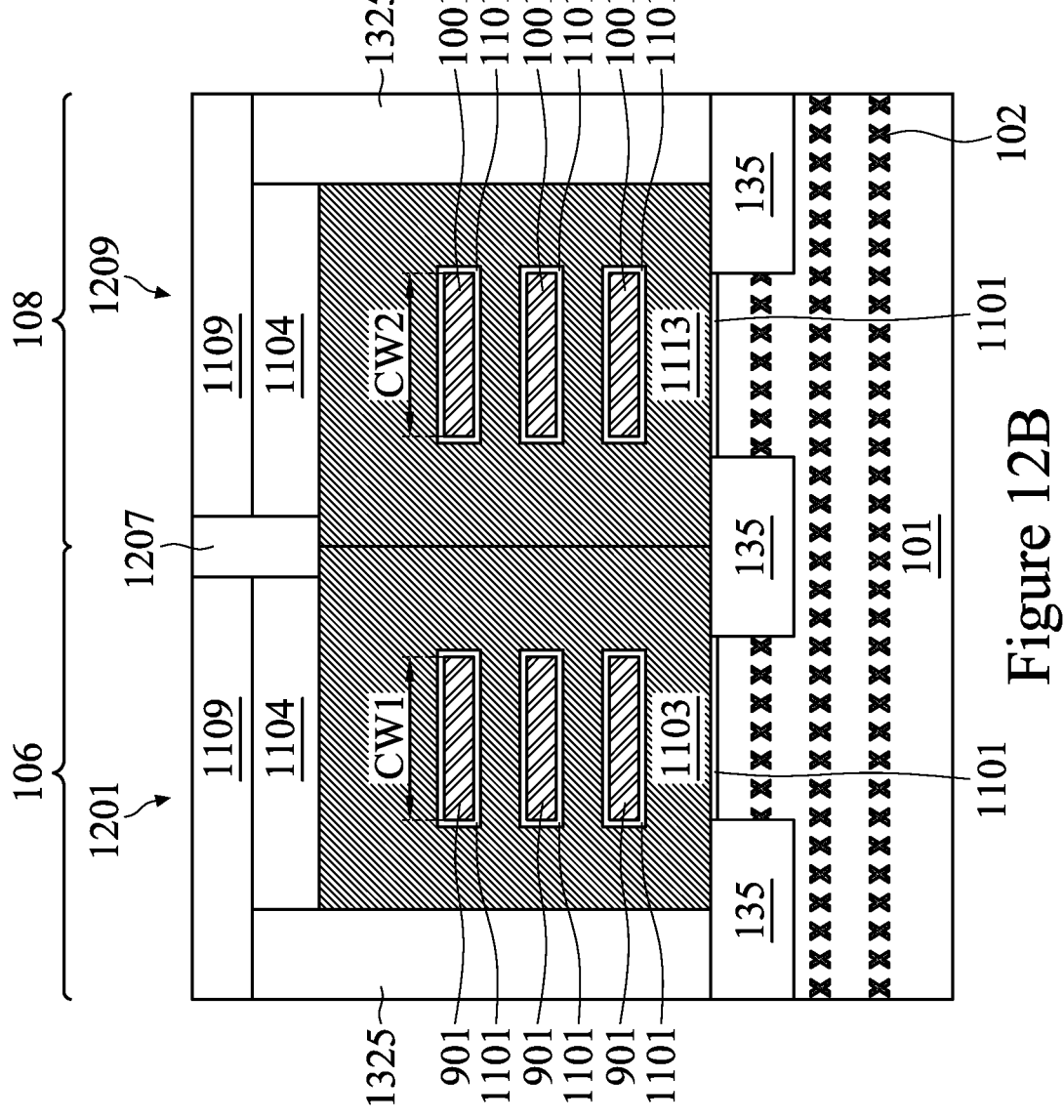
FIG. 12B illustrates a cross-sectional view through a set of the GAA transistors in the semiconductor device of FIG. 12A, the set of GAA transistors being arranged as a CMOS device, in accordance with some embodiments.

FIG. 12B illustrates the cross-sectional view taken through line B-B' of FIG. 12A, in accordance with some embodiments. As illustrated, the first gate electrode 1103 of the second NMOS gate all around transistor 1203 is formed adjacent to the second gate electrode 1113 of the second PMOS gate all around transistor 1209. Additionally, a single gate via 1207 is utilized to electrically connect both the first gate electrode 1103 and the second gate electrode 1113.

FIG. 12B further illustrates that the first nanostructures 901 are formed to have a first channel width CW1 and the second nanostructures 1001 are formed to have a second channel width CW2. The first channel width CW1 and the second channel width CW2 may be formed to a same width, or they may be formed to have different widths depending on the desired device characteristics of the second NMOS gate all around transistor 1203 and the second PMOS gate all around transistor 1209. According to some embodiments, the first channel width CW1 and the second channel width CW2 are formed to be approximately a same width of between about 5 nm and about 70 nm, such as about 25 nm. However, any suitable widths may be used.

Figure 13:
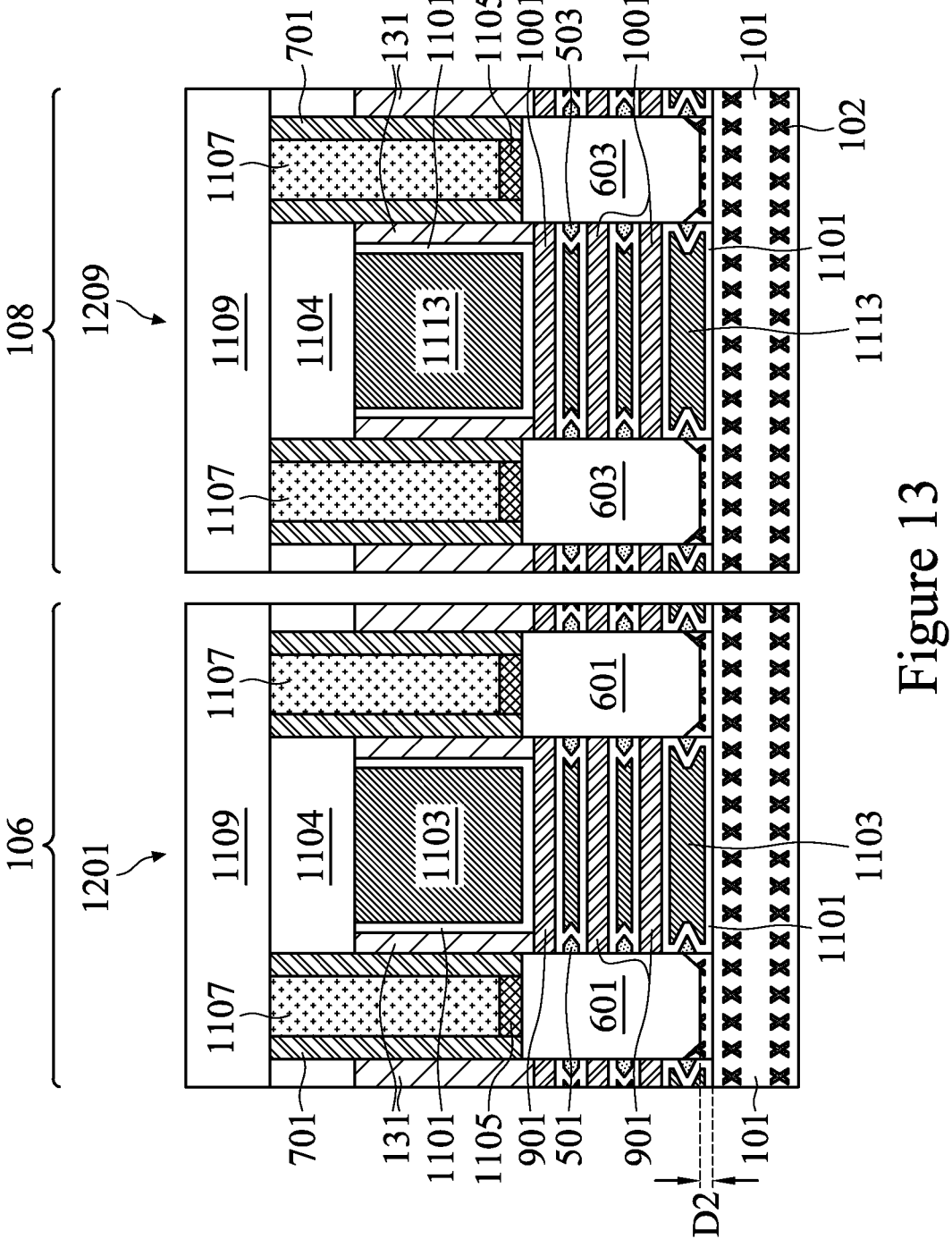
FIG. 13 illustrates cross-sectional views through a first GAA transistor formed as an NMOSFET and a second GAA transistor formed as a PMOSFET of the semiconductor device, in accordance with some embodiments.

FIG. 13 illustrates, in accordance with another embodiment in which the first source/drain regions 601 and the second source/drain regions 603 are formed to a shallower depth such that the first source/drain regions 601 and the second source/drain regions 603 remain outside of the substrate 101. In this embodiment the openings 133 (see FIG. 5) are etched to a smaller distance, such that the openings 133 do not actually extend into the substrate 101 itself. By keeping the openings 133 out of the substrate 101, an isolation margin may be achieved, thereby isolating the first source/drain regions 601 and the second source/drain regions 603 from the substrate 101. In an embodiment the isolation margin having a second distance D2 of between about 2 nm and about 15 nm, such as about 5 nm. However, any suitable distance may be utilized.

The extra space provided by the isolation margin allows for at least some of the material of the first layer 251 to remain between the first source/drain region 601 and the substrate 101. As such, the material of the first layer 251, while being partially removed during the etching of the openings 133, is not fully removed. Further, because a portion of the material of the first layer 251 remains present, at least some of the APT dopants 102 will also remain between the first source/drain region 601 and the substrate 101. However, the APT dopants 102 remain outside of the first nanostructures 901.

The embodiments disclosed herein relate to semiconductor devices and their manufacturing methods, and more particularly to semiconductor devices comprising a transistor having gate all around (GAA) transistor structures and manufacturing methods thereof. According to some embodiments, different thickness in an epi-growth scheme is adopted to create different sheet spacings within the same device channel regions for use in manufacturing vertically stacked nanostructure (nanosheet, nanowire, or the like) GAA devices. The different sheet spacings within the same device channel regions mitigates issues with the anti-punch through (APT) doping induced bottom sheet Vt shift (e.g., a higher Vt is realized due to extra doping species from APT dopant out-diffusion). In some embodiments, the bottom sheet to gate-bulk spacing (e.g., S1) is larger than the inner sheet-sheet spacing (e.g., S2).

Furthermore, the present embodiments provide one or more advantages from the extra distance provided by the different sheet spacing within the same device channel provides for a guard band preventing APT dopants from out-diffusing into the channel regions. Additionally, the larger sheet-bulk distance also provides extra margin (source/drain to bottom sheet connection) to implement a shallow source/drain depth scheme, thereby allowing for either a reduction in the device's device Isoff or else a mitigation of junction leakage and out-diffusion impacts of the APT dosage. Finally, because the APT dopants are implanted prior to deposition of the overlying layers, there is no well proximity effect or APT contamination, thereby allowing the threshold voltage Vt of the devices to be purely controlled by the work function gate or else is controlled by a subsequent channel implant dosage. As such, mismatches in the threshold voltages of different devices can be reduced.

According to an embodiment, a method includes: depositing a first layer of a first material over a semiconductor substrate; depositing a first layer of a second material over the first layer of the first material; depositing a second layer of the first material over the first layer of the second material, a thickness of the first layer of the first material being greater than a thickness of the second layer of the first material; depositing a second layer of the second material over the second layer of the first material; removing the first material from between the first layer of the second material and the semiconductor substrate and from between the first layer of the second material and the second layer of the second material to form a first nanostructure spaced apart from the semiconductor substrate by a first spacing and to form a second nanostructure spaced apart from the first nanostructure by a second spacing, the second spacing being less than the first spacing; depositing a gate dielectric layer to surround the first and second nanostructures; and depositing a gate electrode around the gate dielectric layer. In an embodiment, the first spacing is between about 1.1 times to about 2 times the second spacing. In an embodiment, the first spacing is between about 6 nm and about 20 nm and the second spacing is between about 5 nm and about 12 nm. In an embodiment, the method further includes, prior to the depositing the first layer of the first material, implanting an anti-punch through dopant in a surface of the semiconductor substrate. In an embodiment, the method further includes: etching a first opening through the first layer of the first material and to a first depth into the semiconductor substrate; and epitaxially growing a first source/drain region in the first opening. In an embodiment, the method further includes: etching a first opening through the first layer of the first material to a first depth; and epitaxially growing a first source/drain region in the first opening, wherein the depositing the gate electrode further includes forming a bottom of the gate electrode to be closer to the semiconductor substrate than the first source/drain region. In an embodiment, the first material includes silicon germanium.

According to another embodiment, a method, includes: implanting anti-punch through dopants into a semiconductor substrate; forming a first layer including a first semiconductor material over the semiconductor substrate to a first thickness; forming a second layer including a second semiconductor material over the first layer to a second thickness, the second semiconductor material being different from the first semiconductor material and the first thickness being greater than the second thickness; heating the semiconductor substrate, wherein the heating the semiconductor substrate causes a concentration gradient of the anti-punch through dopants to extend into the first layer but not into the second layer; removing the first semiconductor material from between the second semiconductor material and the semiconductor substrate to form a first nanostructure spaced apart from the semiconductor substrate by a first distance; depositing a gate dielectric layer to surround the first nanostructure; and forming a gate electrode, wherein at least a first portion of the gate electrode is formed between the semiconductor substrate and the first nanostructure. In an embodiment of the method, the first thickness is between about 6 nm and about 20 nm and the second thickness is between about 5 nm and about 12 nm. In an embodiment, the method further includes: forming a third layer over the second layer to a third thickness, the third layer including the first semiconductor material, the third thickness being less than the first thickness; forming a fourth layer over the third layer to a fourth thickness, the fourth layer including the second semiconductor material, the fourth thickness being less than the first thickness; and removing the first semiconductor material from between the fourth layer and the second layer to form a second nanostructure spaced apart from the first nanostructure by a second distance, the second distance being less than the first distance. In an embodiment of the method, the forming the gate electrode includes forming a second portion of the gate electrode between the first nanostructure and the second nanostructure, a first height of the first portion of the gate electrode being greater than a second height of the second portion of the gate electrode. In an embodiment of the method, a first height of the first portion of the gate electrode is between about 1.1 times to about 2.0 times a second height of the second portion of the gate electrode. In an embodiment, the method further includes: forming a first source/drain region, the first source/drain region extending into the semiconductor substrate. In an embodiment, the method further includes: forming a first source/drain region, a bottom of the first source/drain region being formed further from the semiconductor substrate than the first portion of the gate electrode.

According to other embodiments, a semiconductor device, including: a stack of semiconductor nanostructures over a substrate; a gate electrode surrounding each semiconductor nanostructure within the stack of semiconductor nanostructures, a first height of the gate electrode between the substrate and a bottommost nanostructure of the stack of semiconductor nanostructures is greater than a second height of the gate electrode between the bottommost nanostructure and another nanostructure of the stack of semiconductor nanostructures; and a gate dielectric between the gate electrode and each semiconductor nanostructure within the stack of semiconductor nanostructures. In an embodiment of the semiconductor device, the first height is between about 1.1 times to about 2.0 times the second height. In an embodiment, the semiconductor device further includes: a source/drain region, wherein the source/drain region extends into the substrate. In an embodiment, the semiconductor device further includes: a source/drain region, wherein a bottom of the source/drain region is located further from the substrate than a bottom of the gate dielectric. In an embodiment of the semiconductor device, the first height is between about 6 nm and about 20 nm and the second height is between about 5 nm and about 12 nm. In an embodiment, the semiconductor device further includes: an anti-punch through dopant located within the substrate but not within the stack of semiconductor nanostructures.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a semiconductor substrate;
a first gate stack and a second gate stack disposed over the semiconductor substrate, wherein at least one of the first gate stack and the second gate stack comprises a plurality of gate layers, and wherein the first gate stack and the second gate stack have an air gap there between;
a first nanostructure extending through the first gate stack and a second nanostructure extending through the second gate stack;
a first gate structure and a second gate structure disposed over the first gate stack and the second gate stack, respectively;
a first dielectric landing pad disposed over a top surface and upper sidewalls of the first gate structure, wherein the first dielectric landing pad is planar with a source/drain contact;
a first plug disposed over the first dielectric landing pad and electrically connected to the first gate structure, wherein a width of the first gate structure is greater than a width of the first plug;
a dielectric layer disposed over the first gate stack, wherein the first dielectric landing pad and the first plug are surrounding by the dielectric layer; and
source/drain regions on opposing sides of the first nanostructure and the second nanostructure, the source/drain regions overlapping an isolation margin region of the semiconductor substrate, the isolation margin region including anti-punch through dopants.

2. The semiconductor device of claim 1, further comprising:
a second dielectric landing pad disposed over a top surface and upper sidewalls of the second gate structure; and
a second plug disposed over the second dielectric landing pad and electrically connected to the second gate structure, wherein a distance between the first plug and the second plug is greater than a distance between the first gate stack and the second gate stack.

3. The semiconductor device of claim 1, wherein the first dielectric landing pad is in direct contact with the dielectric layer.

4. The semiconductor device of claim 1, wherein the first nanostructure is spaced apart from the semiconductor substrate by a first spacing, and
the second nanostructure is spaced apart from the first nanostructure by a second spacing, the second spacing being less than the first spacing.

5. The semiconductor device of claim 4, wherein a concentration gradient of the anti-punch through dopants does not extend into the first nanostructure.

6. The semiconductor device of claim 5, wherein the first spacing is between about 6 nm and about 20 nm.

7. The semiconductor device of claim 6, wherein the second spacing is between about 5 nm and about 12 nm.

8. A semiconductor device, comprising:

a first gate stack and a second gate stack over a semiconductor substrate, wherein at least one of the first gate stack and the second gate stack comprises a plurality of gate layers, and wherein the first gate stack and the second gate stack have an air gap therebetween;

a first nanostructure that extends through the first gate stack;

a first gate structure and a second gate structure over the first gate stack and the second gate stack, respectively;

a first dielectric layer surrounding the first gate structure and the second gate structure;

a first dielectric landing pad over a top surface and upper sidewalls of the first gate structure and a second dielectric landing pad over a top surface and upper sidewalls of the second gate structure;

a second dielectric layer overlying the first dielectric landing pad and the second dielectric landing pad;

a first source/drain adjacent to the first gate stack;

an isolation margin region of anti-punch through dopants between the first source/drain and the semiconductor substrate;

a first source/drain contact in physical contact with the first source/drain, the first source/drain contact being planar with the first dielectric landing pad; and a first plug in the second dielectric layer and over the first dielectric landing pad, wherein a width of the first gate structure is greater than a width of the first plug.

9. The semiconductor device of claim 8, further comprising:

a second plug in the second dielectric layer and over the second dielectric landing pad, wherein a distance between the first plug and the second plug is greater than a distance between the first gate stack and the second gate stack.

10. The semiconductor device of claim 8, further comprising dopants to obstruct punch through in the semiconductor substrate.

11. The semiconductor device of claim 8, wherein the first nanostructure is separated from the semiconductor substrate by a first spacing, and a second nanostructure extends through the first gate stack and is separated from the first nanostructure by a second spacing less than the first spacing.

12. The semiconductor device of claim 11, wherein a bottom of the first gate stack is closer to the semiconductor substrate than a bottom of the first source/drain.

13. The semiconductor device of claim 11, wherein the second spacing is between about 5 nm and about 12 nm.

14. A semiconductor device, comprising:

a first stack of nanostructures over a semiconductor substrate;

a second stack of nanostructures over the semiconductor substrate;

a first gate electrode, wherein a first portion of the first gate electrode is within the first stack of nanostructures and wherein a second portion of the first gate electrode is over the first stack of nanostructures;

a second gate electrode, wherein a first portion of the second gate electrode is within the second stack of nanostructures and wherein a second portion of the second gate electrode is over the second stack of nanostructures;

a first cap disposed over a top surface and upper sidewalls of the first gate electrode, the first cap having a planar top surface, the planar top surface aligned with a top surface of a source/drain contact;

a first plug disposed over the first cap and electrically connected to the first gate electrode, wherein a width of the first gate electrode is greater than a width of the first plug;

a dielectric layer on opposing sides of the first cap and the first plug; and source/drain regions on opposing sides of the first stack of nanostructures and the second stack of nanostructures, the source/drain regions separated from the semiconductor substrate by an isolation margin region of anti-punch through dopants.

15. The semiconductor device of claim 14, further comprising a second cap disposed over a top surface and upper sidewalls of the second gate electrode.

16. The semiconductor device of claim 15, further comprising a second plug disposed over the second cap and electrically connected to the second gate electrode, wherein a width of the second gate electrode is greater than a width of the second plug.

17. The semiconductor device of claim 14, further comprising:

a first nanostructure within the first stack of nanostructures and separated from the semiconductor substrate by a first spacing; and a second nanostructure within the first stack of nanostructures and separated from the first nanostructure by a second spacing less than the first spacing.

18. The semiconductor device of claim 17, further comprising dopants to obstruct punch through in the semiconductor substrate.

19. The semiconductor device of claim 18, wherein a concentration gradient of the dopants to obstruct punch through does not extend into the first nanostructure.

20. The semiconductor device of claim 17, wherein the first spacing is between about 6 nm and about 20 nm, and the second spacing is between about 5 nm and about 12 nm.

* * * * *